US012598386B2

(12) United States Patent
Perez Noguera

(10) Patent No.: US 12,598,386 B2
(45) Date of Patent: Apr. 7, 2026

(54) MEMS-BASED IMAGING DEVICES

(71) Applicant: Microsoft Technology Licensing, LLC, Redmond, WA (US)

(72) Inventor: Gritsko Perez Noguera, Tampere (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 205 days.

(21) Appl. No.: 18/216,038

(22) Filed: Jun. 29, 2023

(65) Prior Publication Data

US 2025/0008220 A1     Jan. 2, 2025

(51) Int. Cl.
| | |
|---|---|
| *H04N 23/68* | (2023.01) |
| *B81B 7/04* | (2006.01) |
| *G02B 26/08* | (2006.01) |
| *H04N 23/54* | (2023.01) |
| *H04N 23/57* | (2023.01) |

(52) U.S. Cl.
CPC ............. *H04N 23/687* (2023.01); *B81B 7/04* (2013.01); *G02B 26/0875* (2013.01); *H04N 23/54* (2023.01); *H04N 23/57* (2023.01); *B81B 2207/012* (2013.01)

(58) Field of Classification Search
CPC ........ H04N 23/55; H04N 23/58; H04N 23/57; H04N 23/54; H04N 23/79; H04N 23/687; H04N 25/79; H04N 25/48; B81B 7/04; B81B 2207/012; G02B 26/0875; G02B 7/08

USPC ........................................................ 348/208.7
See application file for complete search history.

(56) References Cited

U.S. PATENT DOCUMENTS

| | | | | |
|---|---|---|---|---|
| 8,768,157 | B2 * | 7/2014 | Gutierrez | ........... G02B 26/0875 396/55 |
| 10,523,135 | B2 * | 12/2019 | Ng | ......................... H04N 23/55 |
| 10,893,200 | B2 * | 1/2021 | Ba-Tis | ..................... G03B 5/06 |
| 11,202,022 | B2 * | 12/2021 | Hsu | ........................ H04N 23/54 |
| 11,407,634 | B2 * | 8/2022 | Ng | ........................ G02B 27/646 |
| 11,614,634 | B2 * | 3/2023 | Giusti | ..................... H10N 30/01 359/557 |
| 11,782,232 | B2 * | 10/2023 | Seo | ...................... H04N 23/951 348/222.1 |

(Continued)

FOREIGN PATENT DOCUMENTS

| | | |
|---|---|---|
| CN | 112311977 A | 2/2021 |
| JP | 2008040240 A | 2/2008 |

(Continued)

OTHER PUBLICATIONS

"Compliant Mechanism", Retrieved From: https://en.wikipedia.org/wiki/Compliant_mechanism, Feb. 14, 2023, 4 Pages.

(Continued)

*Primary Examiner* — Pritham D Prabhakher
(74) *Attorney, Agent, or Firm* — Rainier Patents, P.S.

(57) ABSTRACT

This document relates to devices employing imaging devices, such as cameras and improved camera performance. In one example the device includes an optical element and a sensing element configured to sense light (Continued)

passing through the optical element. This example includes a set of MEMS actuators configured to be individually selectively controlled to create six degrees of freedom (6DoF) movement between the sensing element and the optical element.

20 Claims, 26 Drawing Sheets

(56) References Cited

U.S. PATENT DOCUMENTS

| | | | | |
|---|---|---|---|---|
| 11,889,203 | B2 * | 1/2024 | Kim | G02B 7/005 |
| 11,932,531 | B2 * | 3/2024 | Chen | H04N 23/687 |
| 2008/0219654 | A1 | 9/2008 | Border et al. | |
| 2013/0077168 | A1 | 3/2013 | Gutierrez | |
| 2016/0190958 | A1 * | 6/2016 | Gutierrez | H02N 1/008 |
| | | | | 318/116 |
| 2016/0212332 | A1 * | 7/2016 | Tang | H04N 23/54 |
| 2017/0242225 | A1 | 8/2017 | Fiske | |
| 2020/0371376 | A1 * | 11/2020 | Giusti | G03B 5/06 |
| 2021/0092297 | A1 | 3/2021 | Smyth et al. | |
| 2021/0143295 | A1 * | 5/2021 | Hsu | H02N 1/008 |
| 2021/0144316 | A1 * | 5/2021 | Hsu | H04N 25/79 |
| 2021/0263259 | A1 | 8/2021 | Seo et al. | |

| | | | | |
|---|---|---|---|---|
| 2022/0252868 | A1 * | 8/2022 | Sarkar | G02B 26/0875 |
| 2023/0204974 | A1 * | 6/2023 | Giusti | G03B 5/06 |
| | | | | 359/557 |
| 2023/0219806 | A1 * | 7/2023 | Chen | H04N 23/687 |
| | | | | 348/208.7 |

FOREIGN PATENT DOCUMENTS

| | | |
|---|---|---|
| WO | 2022197001 A1 | 9/2022 |
| WO | 2022233289 A1 | 11/2022 |

OTHER PUBLICATIONS

"Flexible Electronics", Retrieved From: https://en.wikipedia.org/wiki/Flexible_electronics, Mar. 27, 2023, 8 Pages.

"Parallel Manipulator", Retrieved From: https://en.wikipedia.org/wiki/Parallel_manipulator, Feb. 2, 2023, 5 Pages.

"Serial Manipulator", Retrieved From: https://en.wikipedia.org/wiki/Serial_manipulator, Feb. 8, 2023, 3 Pages.

"Using Origami and Kirigami to Inspire Reconfigurable Yet Structural Materials", Retrieved From: https://phys.org/news/2022-05-origami-kirigami-reconfigurable-materials.html, May 25, 2022, 2 Pages.

Liu, et al., "A Heterogeneous Architecture for the Vision Processing Unit with a Hybrid Deep Neural Network Accelerator", In Journal of Micromachines, vol. 13 , Issue 2, Feb. 7, 2022, pp. 1-27.

International Search Report and Written Opinion received for PCT Application No. PCT/US2024/031518, Aug. 20, 2024, 14 pages.

* cited by examiner

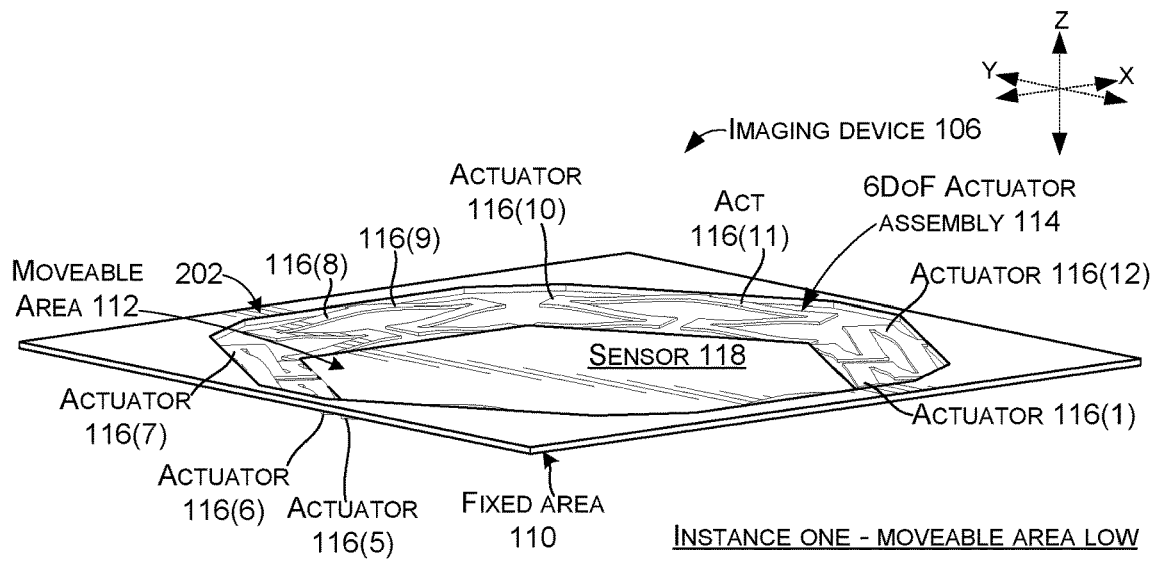
INSTANCE ONE - MOVEABLE AREA LOW
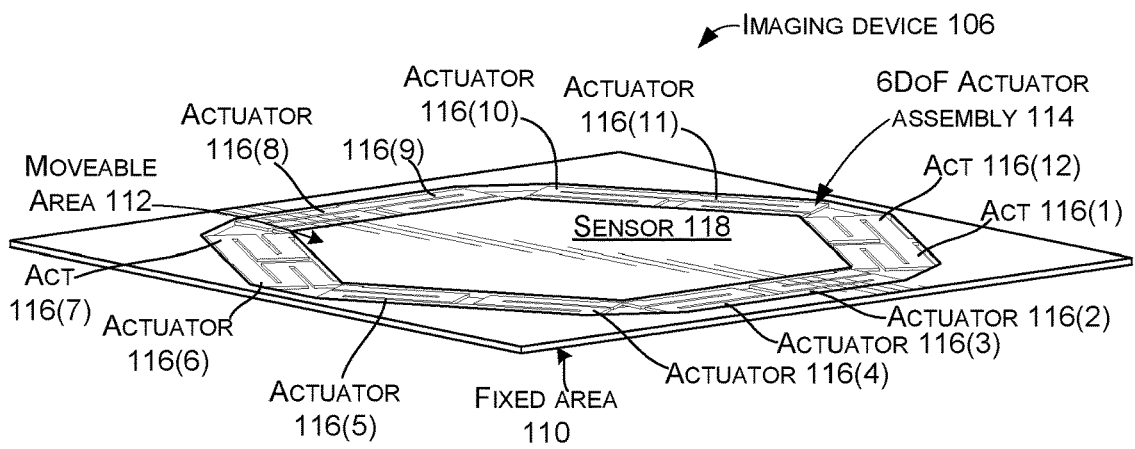
INSTANCE TWO - MOVEABLE AREA NEUTRAL
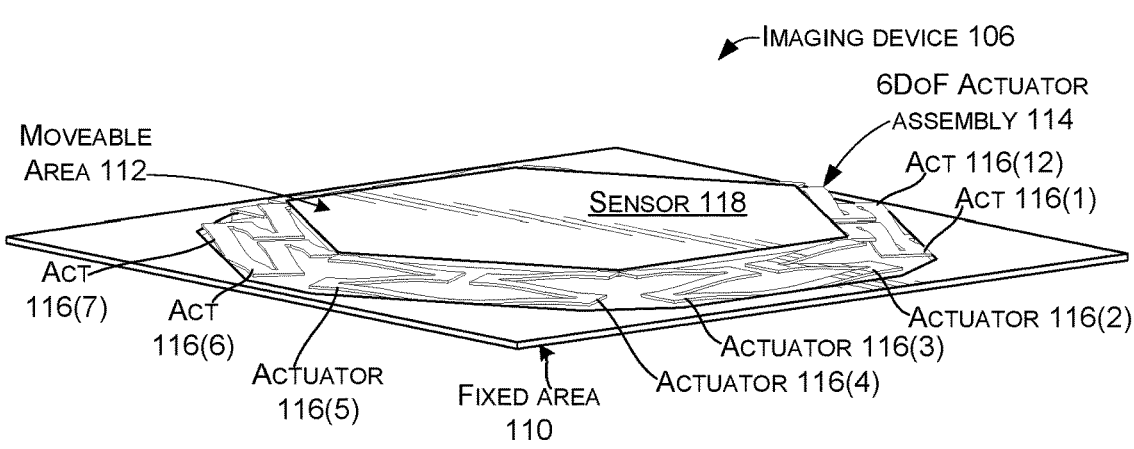
FIG. 2B                    INSTANCE THREE - MOVEABLE AREA HIGH

INSTANCE ONE - MOVEABLE AREA LOW

INSTANCE TWO - MOVEABLE AREA NEUTRAL

INSTANCE THREE - MOVEABLE AREA HIGH

INSTANCE ONE – TILT MOVEABLE AREA RIGHT

INSTANCE TWO – NEUTRAL

INSTANCE THREE – TILT MOVEABLE AREA LEFT

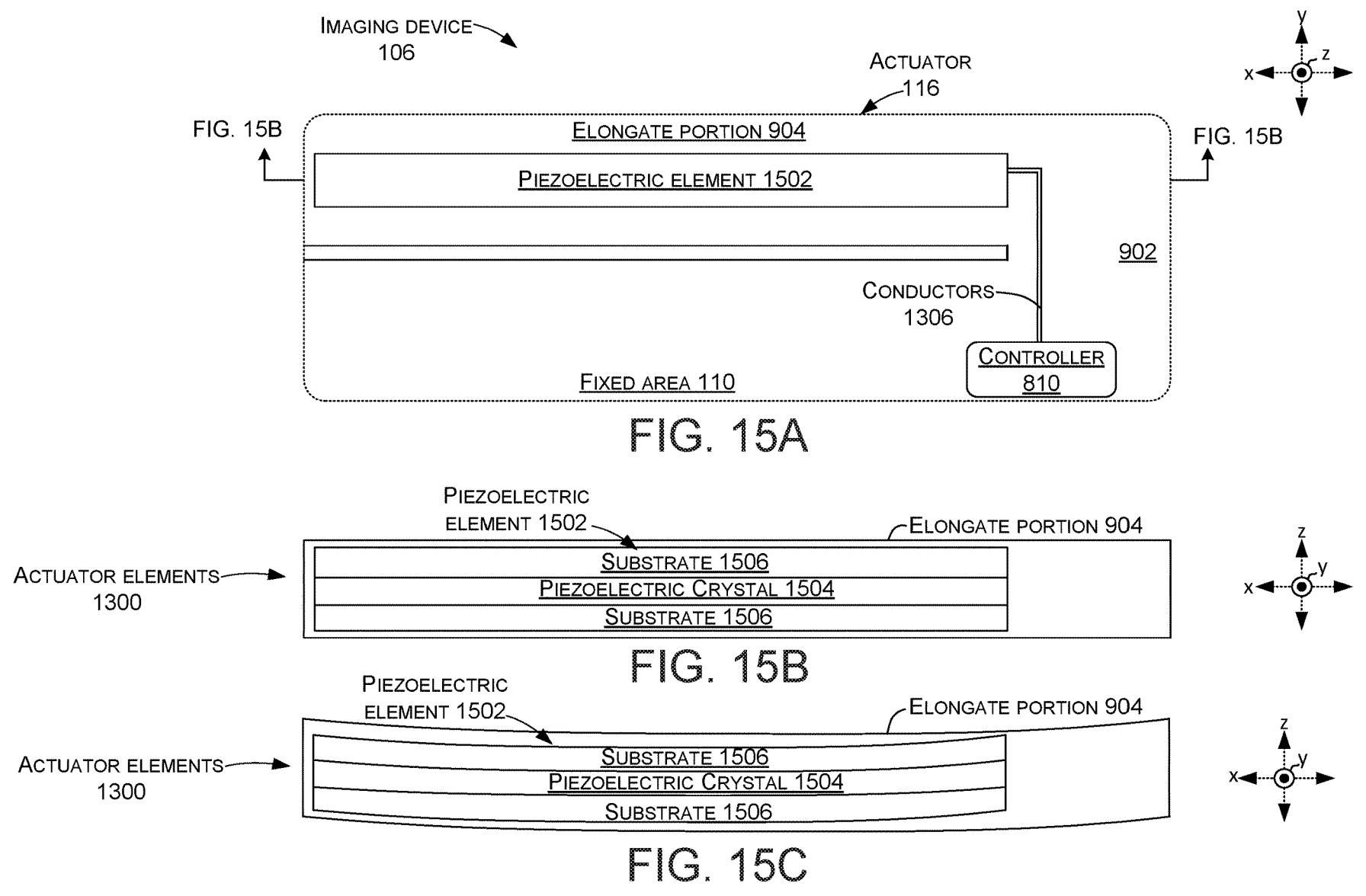

IMAGING DEVICE 106

ACTUATOR 116

ELONGATE PORTION 904

PIEZOELECTRIC ELEMENT 1502

902

CONTROLLER 810

CONDUCTORS 1306

FIXED AREA 110

ELONGATE PORTION 904

PIEZOELECTRIC ELEMENT 1502

SUBSTRATE 1506

PIEZOELECTRIC CRYSTAL 1504

SUBSTRATE 1506

ACTUATOR ELEMENTS 1300

FIG. 15B

ELONGATE PORTION 904

PIEZOELECTRIC ELEMENT 1502

SUBSTRATE 1506

PIEZOELECTRIC CRYSTAL 1504

SUBSTRATE 1506

ACTUATOR ELEMENTS 1300

FIG. 15C

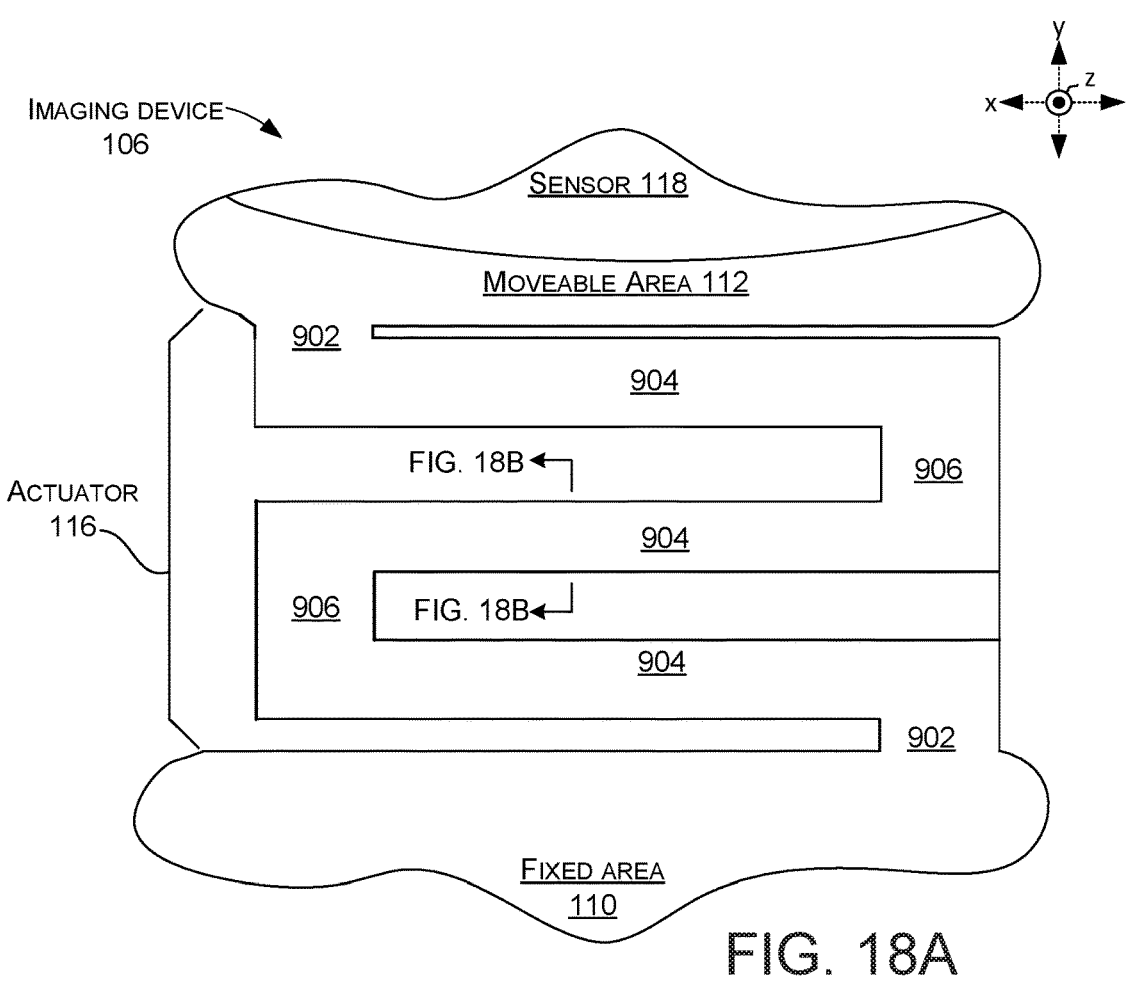
IMAGING DEVICE
106
SENSOR 118
MOVEABLE AREA 112
902
904
FIG. 18B
906
904
906
FIG. 18B
904
902
ACTUATOR
116
FIXED AREA
110
FIG. 18A
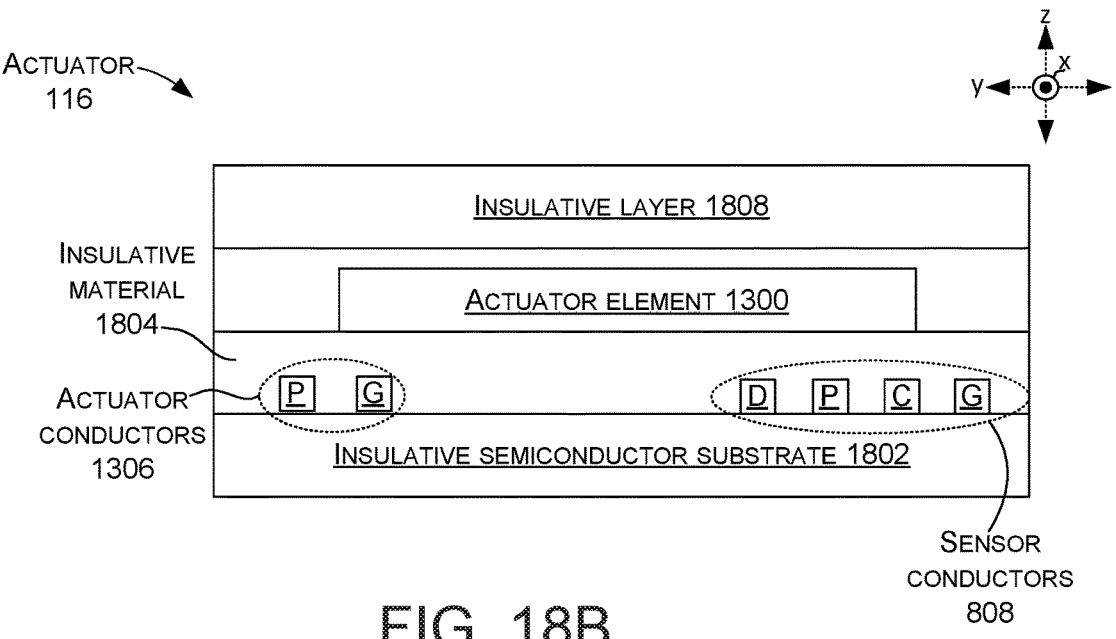
ACTUATOR
116
INSULATIVE LAYER 1808
INSULATIVE
MATERIAL
1804
ACTUATOR ELEMENT 1300
ACTUATOR
CONDUCTORS
1306
P   G
D   P   C   G
INSULATIVE SEMICONDUCTOR SUBSTRATE 1802
SENSOR
CONDUCTORS
808
FIG. 18B

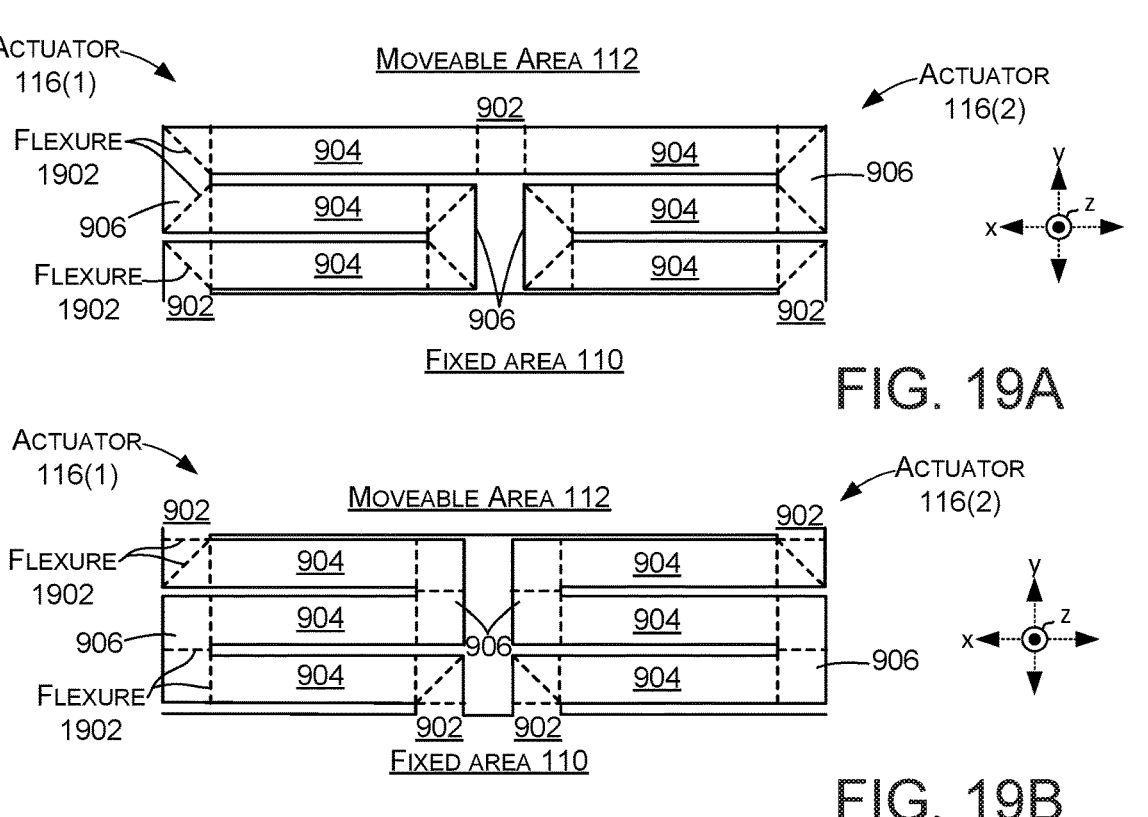
FIG. 19A
FIG. 19B
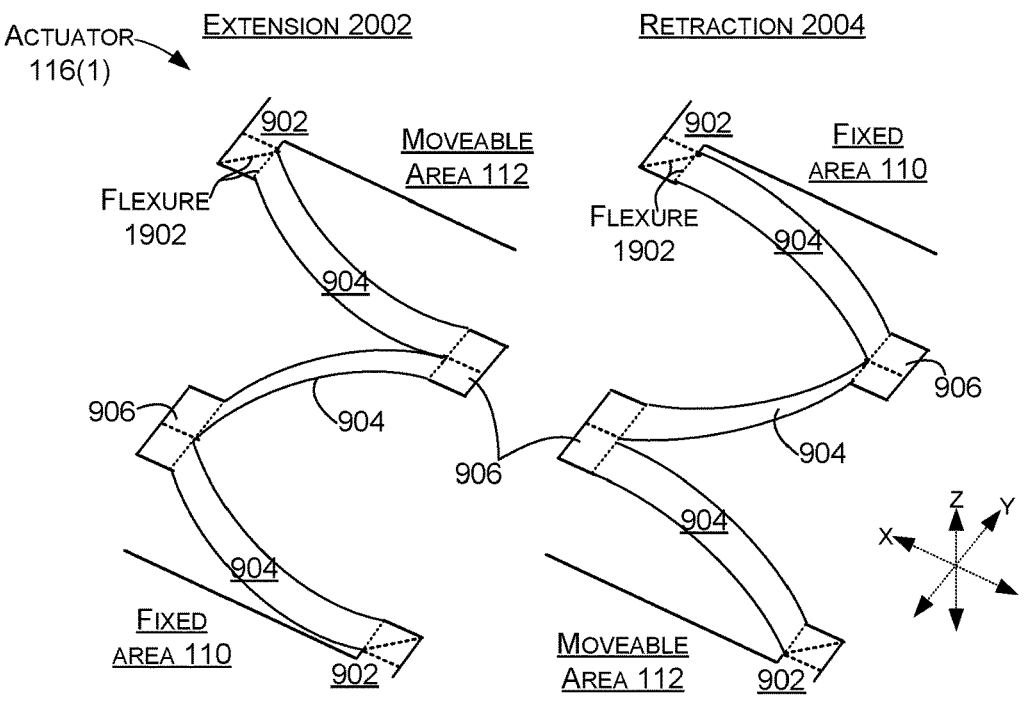
FIG. 20

IMAGING DEVICE 106

IMAGING DEVICE 106

USE CASE SCENARIO 2500

USE CASE SCENARIO 2600

Figure 28:
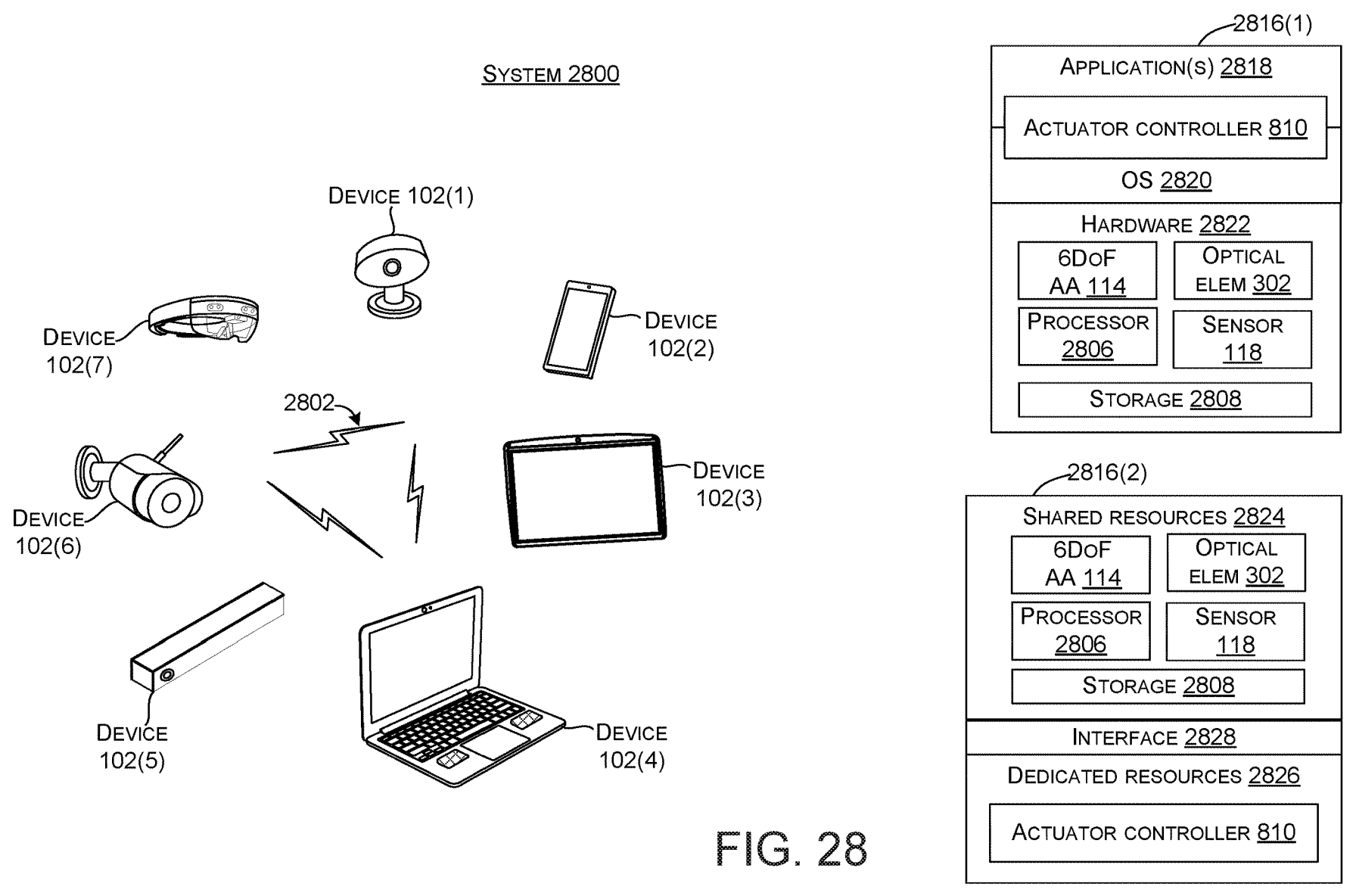

2816(1)

APPLICATION(S) 2818

ACTUATOR CONTROLLER 810

OS 2820

HARDWARE 2822

OPTICAL ELEM 302

SENSOR 118

6DoF AA 114

PROCESSOR 2806

STORAGE 2808

2816(2)

SHARED RESOURCES 2824

OPTICAL ELEM 302

SENSOR 118

6DoF AA 114

PROCESSOR 2806

STORAGE 2808

INTERFACE 2828

DEDICATED RESOURCES 2826

ACTUATOR CONTROLLER 810

SYSTEM 2800

DEVICE 102(1)

DEVICE 102(2)

DEVICE 102(3)

DEVICE 102(4)

DEVICE 102(5)

DEVICE 102(6)

DEVICE 102(7)

MEMS-BASED IMAGING DEVICES

BACKGROUND

Imaging devices include an optical element and a sensing element. Improved fabrication techniques have allowed imaging devices to be reduced in size and cost while in many cases offering enhanced performance. This has allowed imaging devices to be included in more devices. For instance, smart phones, tablets, and notebook computers include multiple imaging devices. Imaging devices are now employed on many other types of devices such as vehicles, drones, etc.

SUMMARY

This patent relates to devices employing imaging devices, such as cameras and to improved camera performance. In one example the device includes an optical element and a sensing element configured to sense image forming light passing through the optical element. This example includes a set of MEMS actuators configured to be individually selectively controlled to create six degrees of freedom (6DoF) movement between the sensing element and the optical element.

This Summary is intended to provide a quick introduction to some of the inventive concepts and is not intended to be inclusive or limiting.

BRIEF DESCRIPTION OF THE DRAWINGS

The Detailed Description is described with reference to the accompanying figures. In the figures, the left-most digit(s) of a reference number identifies the figure in which the reference number first appears. The use of similar reference numbers in different instances in the description and the figures may indicate similar or identical items. Where space permits element names and element numerical designators are both shown on the drawing page for the reader's convenience. Otherwise, only the element numerical designators are shown.

FIGS. 1, 3-15A, 16A, 17A-18A, 19A, 19B, 21-24, and 27B show elevational views of example devices in accordance with some implementations of the present concepts.

FIGS. 2A, 2B, and 20 show perspective views of example devices in accordance with some implementations of the present concepts.

FIGS. 15B, 15C, 16B, 16C, 18B, and 27A show sectional views of example devices in accordance with some implementations of the present concepts.

FIG. 28 shows an example system in accordance with some implementations of the present concepts.

DETAILED DESCRIPTION

Overview

Imaging devices, such as cameras, have benefitted from technological advances so that current imaging devices are relatively highly performing, relatively small, and relatively inexpensive. Imaging devices include an optical element and a sensing element. The majority of the advances have related to miniaturizing optical elements and sensing elements that are (spatially) fixed relative to one another. This fixed configuration is economical but greatly limits the performance capabilities of the imaging devices. To address this issue, many devices, such as smart phones, employ a cluster of fixed imaging devices together on the device. Individual imaging devices can be specialized for specific scenarios, such as one for long distances and one for wide angles, etc. Attempts have been made to provide limited relative movement between the optical element and the sensing element. However, the attempts have provided only limited relative movement and performance gains have been minimal.

The present concepts include a technical solution that involves a microelectromechanical systems (MEMS)-based imaging device that provides full relative movement in the form of translational and rotational movement (e.g., six degrees of freedom (6DoF)) between the optical element and the sensing element. The 6DoF movement can be applied to the optical element, the sensing element, or both the optical element and the sensing element. The 6DoF movement is accomplished with a set of individually controllable MEMS actuators. This technical solution provided by this 6DoF configuration can provide greatly enhanced performance compared to existing imaging devices. For instance, the technical solution can provide higher resolution images than can be obtained with a fixed lens and sensor of a given resolution. This aspect is described in more detail below. Note that the present concepts can provide 6DoF, however, some implementations may provide desired performance with less degrees of freedom. The present concepts are equally applicable to those implementations.

Figure 1:
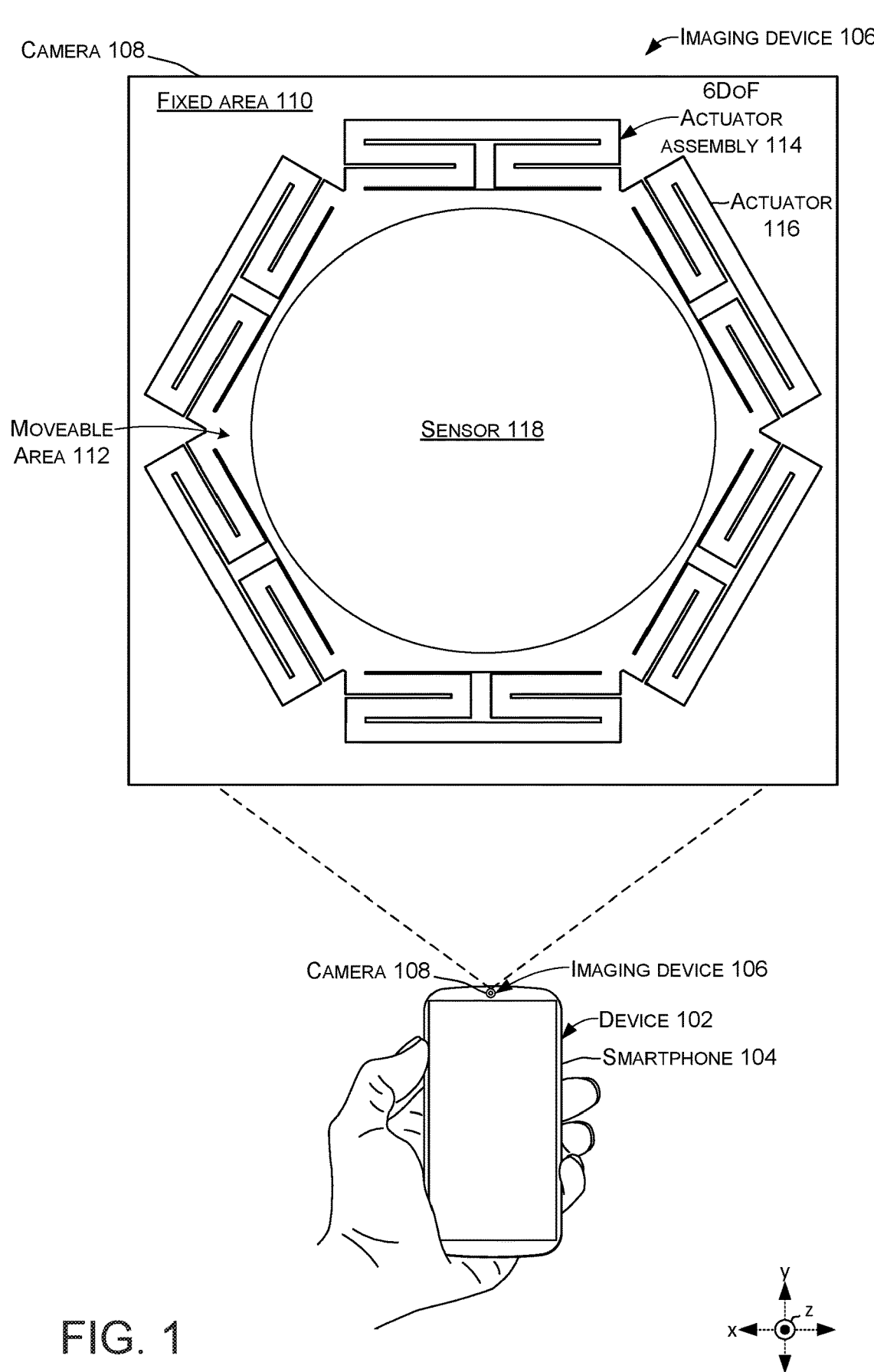

Introductory FIG. 1 shows a device 102 in the form of a smart phone 104 that includes an example 6DoF imaging device 106 in the form of a camera 108. The 6DoF imaging device 106 includes a fixed area 110 and a moveable area 112 separated by a 6DoF actuator assembly 114. The 6DoF actuator assembly 114 includes six or more individually controllable actuators 116. In this case, a sensing element or sensor 118 occupies some or all of the moveable area 112. As discussed below relative to FIGS. 6 and 7, an optical element can alternatively be positioned on the moveable area 112. Note that the 6DoF actuator assembly 114 can independently control six or more actuators 116 to provide 6DoF movement. Some implementations may provide desired performance with less than 6DoF movement. Thus, fewer actuators 116 may be employed and independently controlled by the 6DoF actuator assembly 114. Examples are shown and discussed relative to FIGS. 21-24.

In the resting or neutral state as shown in FIG. 1, the fixed area 110, the 6DoF actuator assembly 114, and the sensor 118 can all be in a common plane (e.g., the XY reference plane). Further, the present concepts provide a technical solution that allows the fixed area 110, the 6DoF actuator assembly 114, and the sensor 118 all to be formed from a single semiconductor substrate that is processed to produce these elements. The fixed area 110, the 6DoF actuator assembly 114, and the sensor 118 can all be formed in a monolithic structure using silicon fabrication processes. In this implementation, the 6DoF actuator assembly 114 is positioned around the periphery of and supports the sensor 118. The 6DoF actuator assembly 114 achieves the 6DoF movement of the sensor 118 from the periphery (e.g., without any structural components that physically move the sensor positioned above or below the sensor).

In the illustrated configuration, the sensor 118 occupies less than an entirety of the moveable area 112. In other configurations, the sensor could occupy all of the moveable area. In this case, the moveable area 112 is hexagonal and the sensor 118 is circular. Other shapes are contemplated. For instance, the sensor 118 could be hexagonal or square, among others.

Figure 2A:
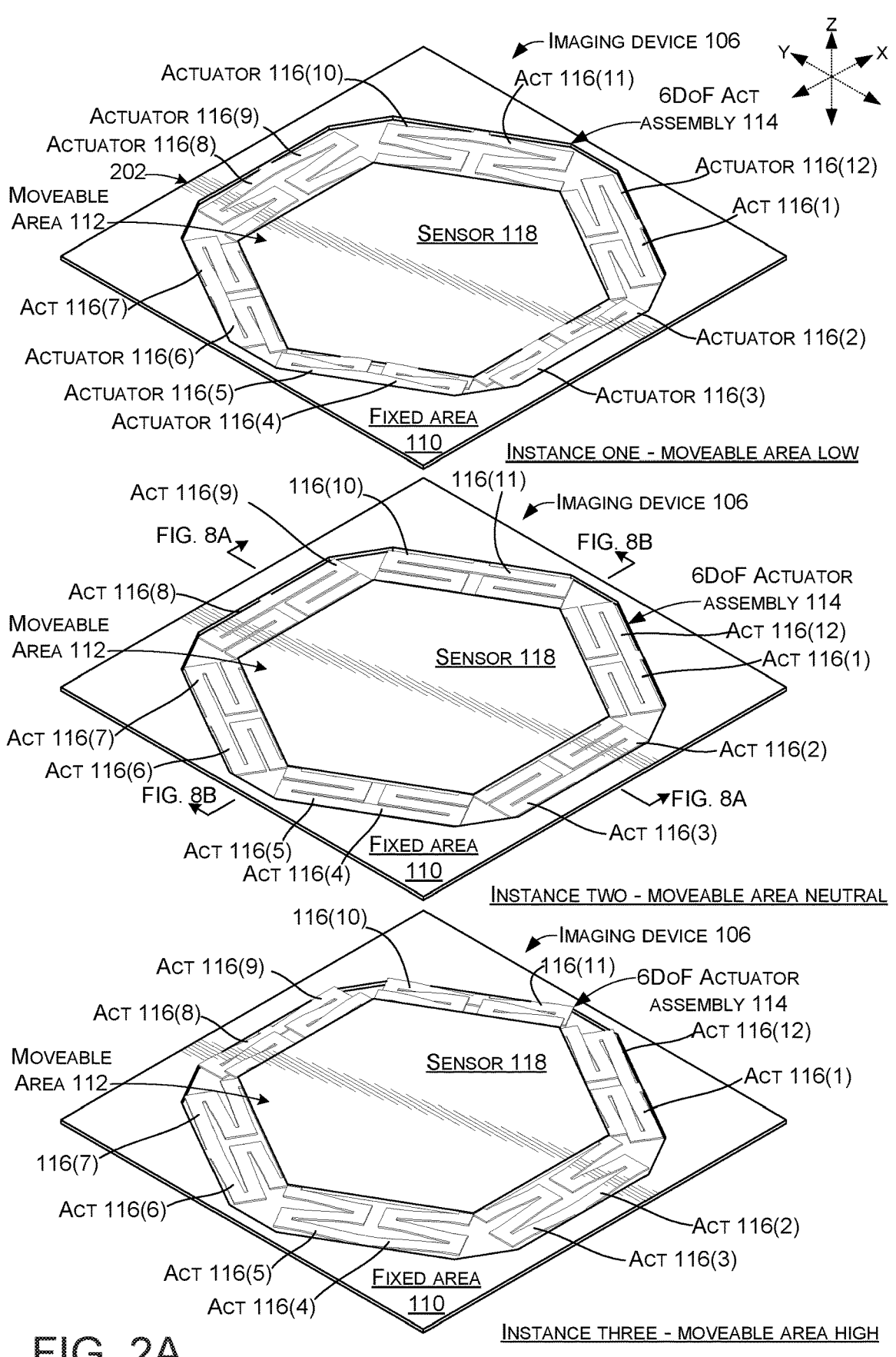

FIGS. 2A and 2B collectively show how individual actuators 116 of the 6DoF actuator assembly 114 can be selectively controlled to move the moveable area 112 relative to the fixed area 110. FIGS. 2A and 2B show the same imaging device 106. FIG. 2A is taken from a higher angle relative to the XY reference plane that contains the fixed area 110. FIG. 2B is taken at a lower angle that may make it easier for the reader to perceive movement of the moveable area 112 in the Z reference direction. In this example, all actuators 116 are being controlled identically to one another. Controlling all actuators 116 in this way creates movement of the moveable area 112 and the sensor 118 in the z reference direction.

Instance One shows the actuators 116 moving the moveable area 112 in the negative Z reference direction (e.g., below the fixed area 110). Instance Two shows the moveable area in a neutral position (e.g., in the same plane as the fixed area 110). This can be viewed as the default condition in some implementations and the imaging device returns to this position if no control signals are sent to the actuators 116. Instance Three shows the actuators 116 moving the moveable area 112 in the positive Z reference direction (e.g., above the fixed area 110). Note that the shading shown at 202 is to help illustrate the relative position of the moveable area 112 relative to the fixed area 110 in the line drawings and is not actually a feature of the imaging device 106.

The movement along the Z reference axis represents one type of motion of the six types of motion (e.g., one of the 6DoF) enabled by the 6DoF actuator assembly. Other types of motion are described below starting relative to FIG. 4. First, relative to FIG. 3, the description provides context for the motion relative to other device components.

As mentioned above, in this implementation, the moveable area 112 is hexagon shaped. One or more actuators 116 is physically coupled to each side of the hexagon shape. This technical solution provides a geometric layout that is conducive to achieving 6DoF movement. However, other geometric shapes can be accommodated. For instance, the moveable area could be circular with actuators 116 coupled at about every 60 degrees around the circular shape. Another implementation can entail a square moveable area 112 with an actuator 116 coupled to each corner of the square (e.g., a total of four actuators). Additional example shapes are illustrated relative to FIGS. 21-24.

Figure 3:
Figure 3:
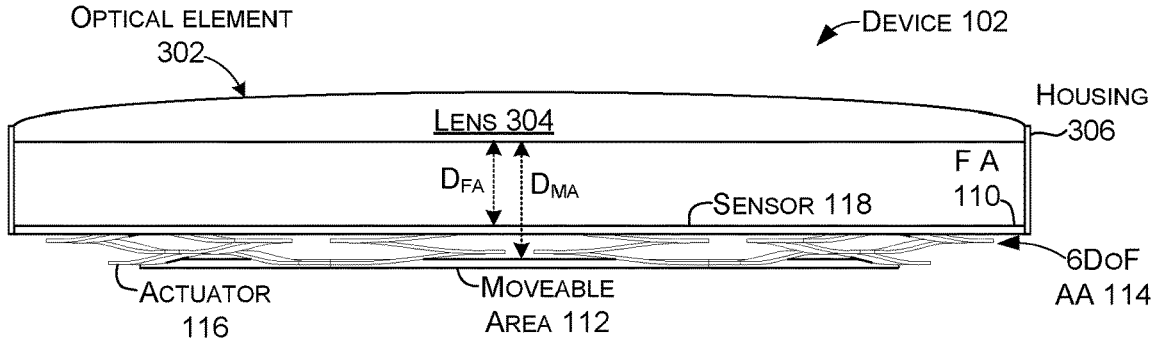
Figure 3:
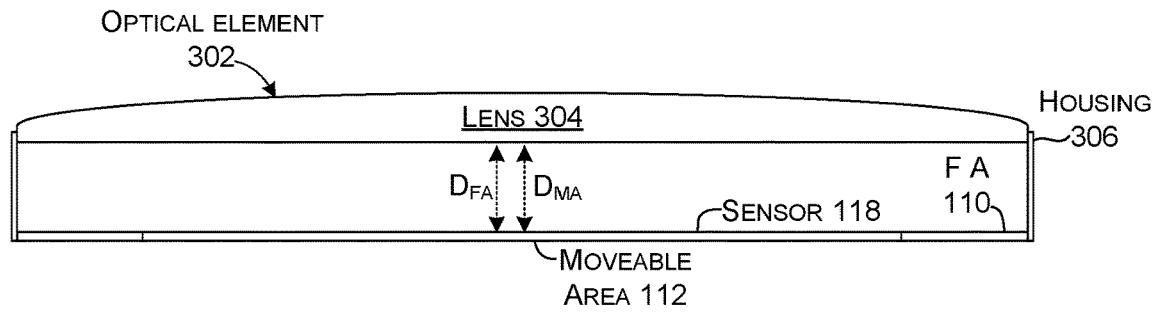
Figure 3:
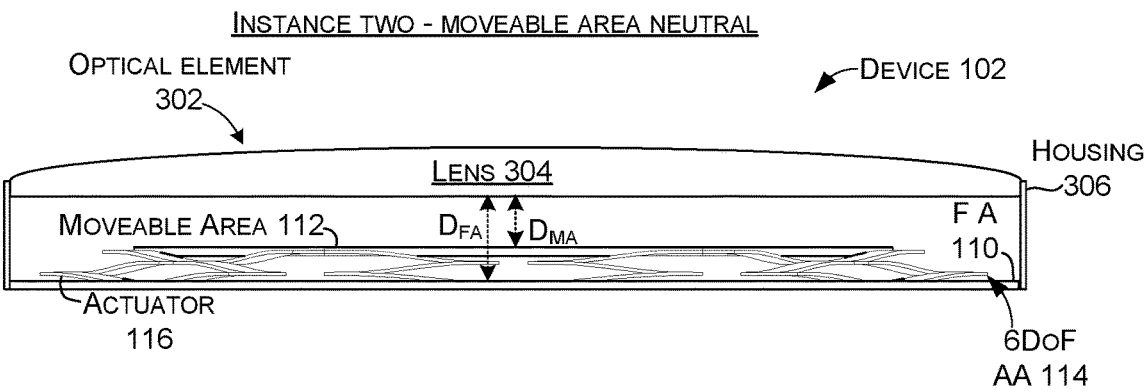

FIG. 3 shows an example device 102 and similar Z reference axis movement as FIGS. 2A and 2B. However, FIG. 3 includes an optical element 302 in the form of a lens 304. In this implementation the optical element 302 is a lens. Other types of lenses or multiple lenses can be employed. In other implementations, the optical element 302 can be a diffractive optical element, a diffraction grating, a metasurface, and/or a polarizer, among others, which perform a variety of functions to enable and/or enhance imaging sensor performance.

A housing 306 or other structure secures the lens 304 at a fixed position above the fixed area 110. Not all of the actuators 116 of the 6DoF actuator assembly 114 are visible and only a representative actuator is labelled in FIG. 3. However, in FIG. 3, the actuators 116 are being controlled uniformly as explained relative to FIGS. 2A and 2B to move moveable area 112 in the Z reference direction.

Instance One shows the actuators 116 controlled to move the moveable area 112 below the fixed area 110 (e.g., away from the lens 304). This is evidenced by the distance (DMA) between the lens 304 and the moveable area 112 being larger than the distance (DFA) between the lens 304 and the fixed area 110. Note that the distance (DFA) between the lens 304 and the fixed area 110 is determined by the housing 306 and does not change.

Instance Two shows the actuators 116 in a neutral position where the actuators 116, the moveable area 112 and the fixed area 110 are all in the same XY reference plane. As a result, the actuators 116 are not visible in this view because they are obscured by a combination of the fixed area 110 and the moveable area 112. At this point, the distance (DMA) between the lens 304 and the moveable area 112 has decreased and is now equal to the distance (DFA) between the lens 304 and the fixed area 110.

Instance Three shows the actuators 116 controlled to move the moveable area 112 above the fixed area 110 (e.g., toward the lens 304). This is evidenced by the distance (DMA) between the lens 304 and the moveable area 112 being smaller than the distance (DFA) between the lens 304 and the fixed area 110.

In this case, the 6DoF actuator assembly 114 provides a technical solution that provides autofocus linear motion along the Z reference axis (e.g., optical axis). The 6DoF actuator assembly 114 moves the sensor 118 toward and away from an object in space (e.g., object of interest). This movement changes the focus distance to the object of interest, enabling focusing on different distances from lens 304 without moving the lens.

The 6DoF actuator assembly 114 also provides a technical solution that allows changing the focus distance to produce images at multiple focal planes, in the form of an array of images. In this functionality, image processing algorithms produce images with user-configurable variations of the amount of blur to be applied to objects and features at distances different from the focal distance. This effect is known as Bokeh in photography. This technical solution provides adjustable Bokeh and replicates the function of a variable aperture (known as an iris diaphragm in optics) in the lens but is achieved without a variable aperture.

The 6DoF actuator assembly 114 also provides a technical solution relating to Plenoptic imaging, also known as light field imaging, which enables a full depth of field capture where all objects and features in object space are in focus.

The 6DoF actuator assembly 114 achieves Plenoptic imaging by capturing a quantity of images as it shifts the sensor 118 to a different distance from lens 304 on each capture. This produces images at several focal planes. Image processing algorithms join these images, replacing the blurred areas for each focal plane with corresponding areas with the highest level of detail from other focal planes.

Figure 4:
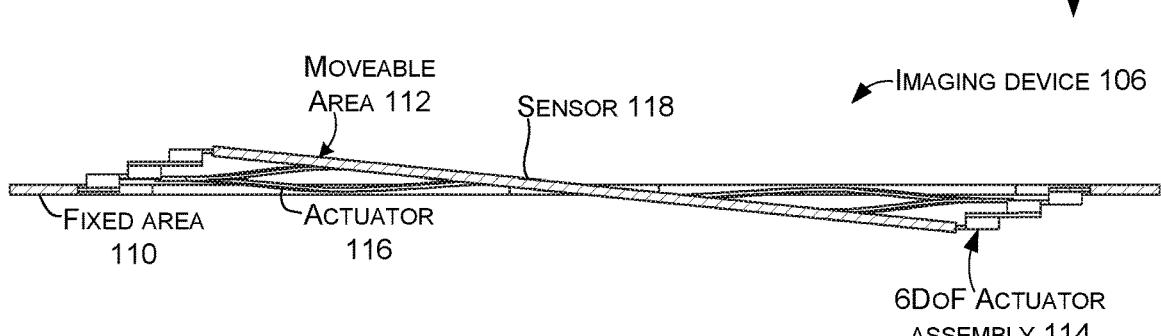
Figure 4:
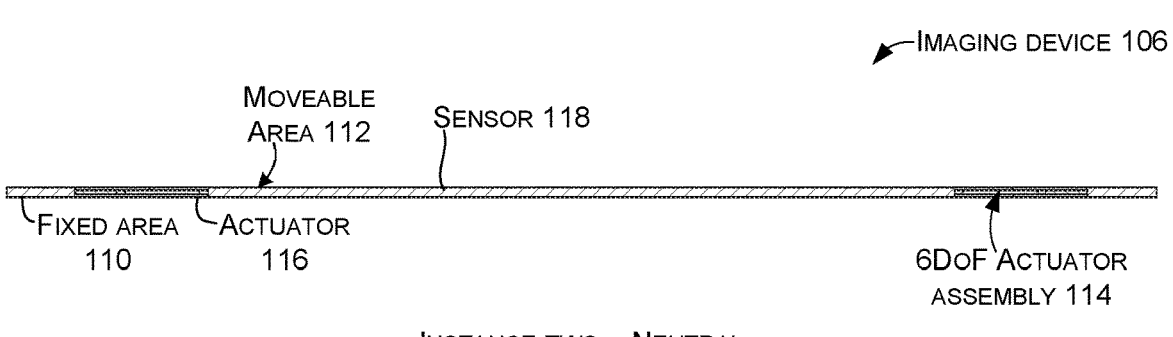
Figure 4:
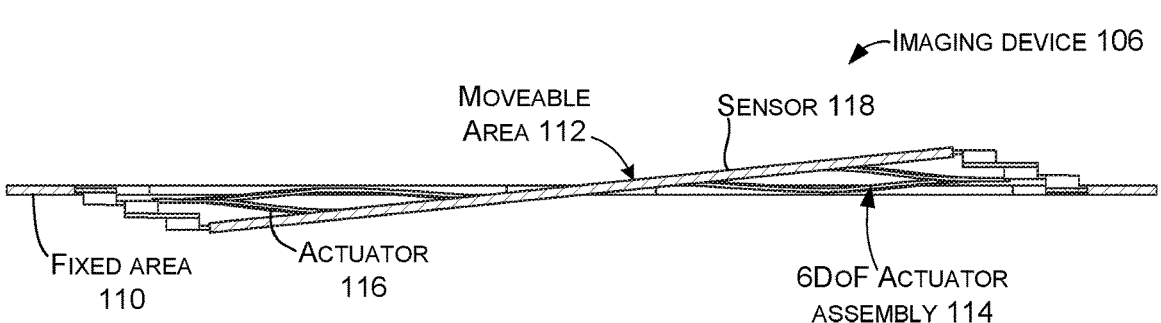

FIG. 4 shows example imaging device 106 and introduces two more types of movement of the moveable area 112 performed by the 6DoF actuator assembly 114. Instance One shows the 6DoF actuator assembly 114 tilting the moveable area 112 and the sensor 118 to the right (e.g., tilting around the y reference axis).

Instance Two shows the actuators 116 in the neutral state so that the moveable area 112 returns to the plane of the fixed area 110. Instance Three shows the actuators 116 tilting the moveable area 112 in the opposite direction to Instance One.

The same principle shown here to tilt the moveable area 112 around the Y reference axis can be applied to tilt the moveable area around the X reference axis. An example use-case scenario that leverages the sensor tilting aspect is described below relative to FIGS. 25 and 26.

The 6DoF actuator assembly's ability to tilt the sensor 118 provides a technical solution that greatly enhances device performance. For instance, in a first scenario, an initial image can be captured by the sensor. This initial image can be analyzed. Assume for purposes of explanation, an object of interest, such as a person is detected in the initial image. Assume further that the object of interest is to the left of center in the initial image. The 6DoF actuator assembly 114 can tilt the sensor 118 to center the object of interest in subsequent images. The process can be iterative to track a moving object of interest to keep it centered (or at least centrally located) in subsequent images.

Another use-case scenario involves image stabilization. In this example, assume that the device includes a set of gyroscopic sensors (not shown) that detect 6DoF device movement. For purposes of explanation, assume that while capturing video with the sensor 118, the 6DoF gyroscopic sensors indicate that the user holding the device tilted the device slightly to the right. This could occur from normal human shaking and/or the user could be on a moving object, such as a car or train. The 6DoF actuator assembly 114 could tilt the sensor a corresponding amount to the left to maintain the field of view captured by the sensor 118.

Figure 5:
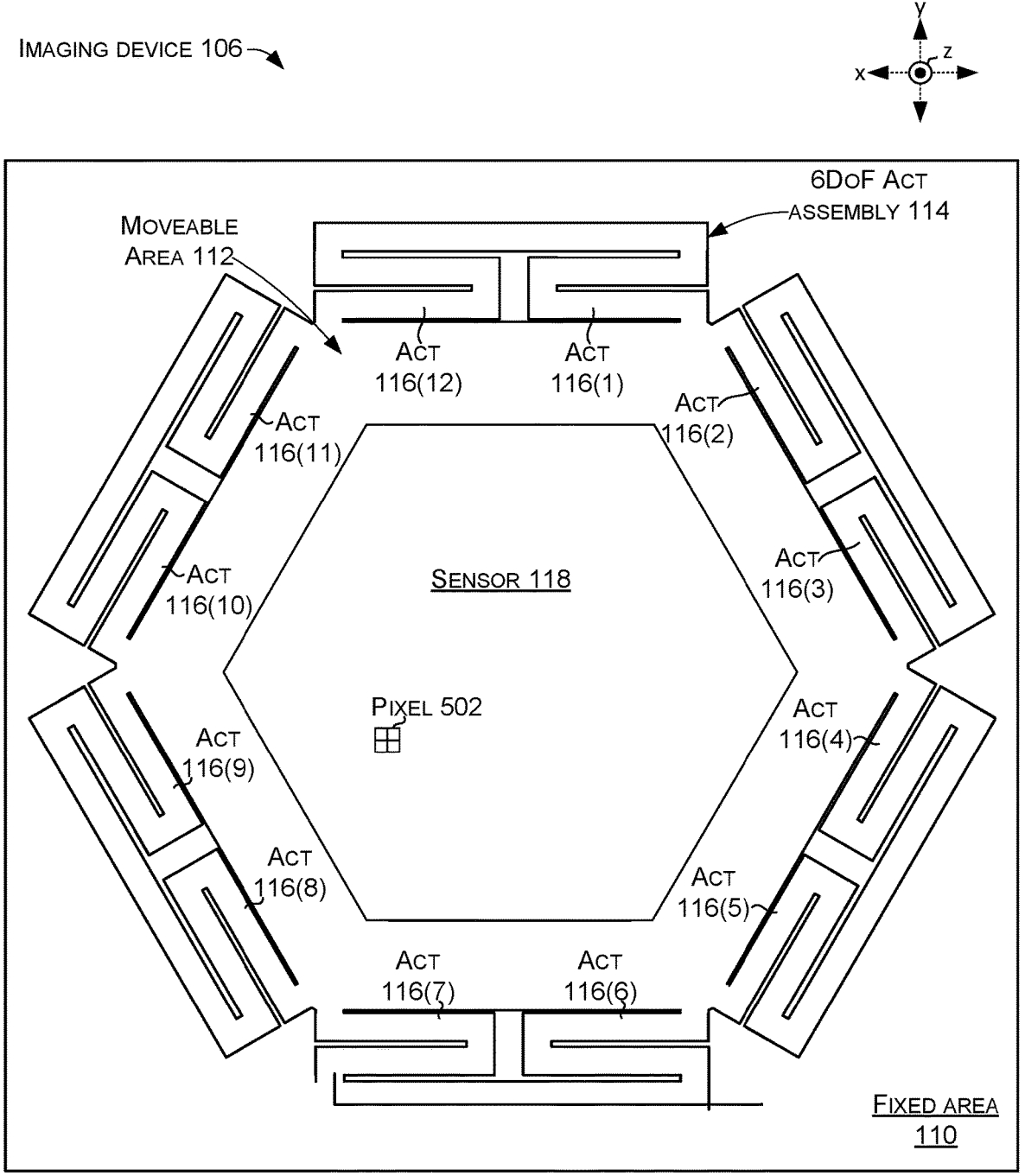

FIG. 5 shows example imaging device 106. FIG. 5 in combination with Table 1 shows how to control the 6DoF actuator assembly 114 to move the moveable area 112 and sensor 118 in two more types of movement. In this case, the 6DoF actuator assembly 114 includes 12 actuators 116. Table 1 shows how to control each individual actuator 116 to shift the moveable area 112 right (e.g. in the +X reference direction), shift the moveable area left (e.g. in the −X reference direction), shift the moveable area up (e.g. in the +Y reference direction), shift the moveable area down (e.g. in the −Y reference direction), rotate the moveable area counter-clockwise (CCW), and rotate the moveable area clockwise. In this example, individual actuators 116 can be controlled to transition into one of three different physical configurations: extend; neutral; or retract. To achieve the desired movement represented in an individual column of Table 1, each actuator 116 can be controlled according to the corresponding row of the table. Table 1 relates to shapes of actuators 116 shown in FIG. 5 or similar to those shown in FIG. 5 (e.g., that approximate an 'S' shape). Different actuator geometries may utilize different Extend/Neutral/ Retract combinations. Additional details relating to the structure of individual actuators 116 and how to control the actuators are described below relative to FIGS. 9-20.

nation that the pixels are ten microns by ten microns in the X and Y reference directions. The 6DoF actuator assembly 114 can provide very fast and very precise movement of the moveable area 112 and hence the pixels 502. In this technical solution, the pixels 502 of the sensor 118 could capture an image. The 6DoF actuator assembly 114 can quickly move the moveable area a sub-pixel distance (e.g., sub-pixel shift), such as five microns. The sensor 118 (e.g., the pixels 502) can then capture another image of the same field of view. The two images can be processed together to produce a higher resolution than the sensor is otherwise capable of (e.g., the combined image can have a resolution finer than the pixel size and the diffraction limit of the lens). This is referred to as super-resolution. The speed and accuracy of movement provided by the 6DoF actuator assembly 114 can achieve super resolution even for video. For instance, even at a 100 hertz refresh rate with the ten micron pixel size described above, the sensor could capture a first image. Then the 6DoF actuator assembly 114 could move the sensor five microns left and the sensor could capture another image. The 6DoF actuator assembly 114 could move the sensor five microns up and the sensor could capture a third image. The 6DoF actuator assembly 114 could move the sensor five microns right and the sensor could capture a fourth image. While the 6DoF actuator assembly 114 moves the sensor five microns down to the original position, the four images could be processed to create a super-resolution image that is displayed for the user as a video frame and/or stored.

Figure 6:
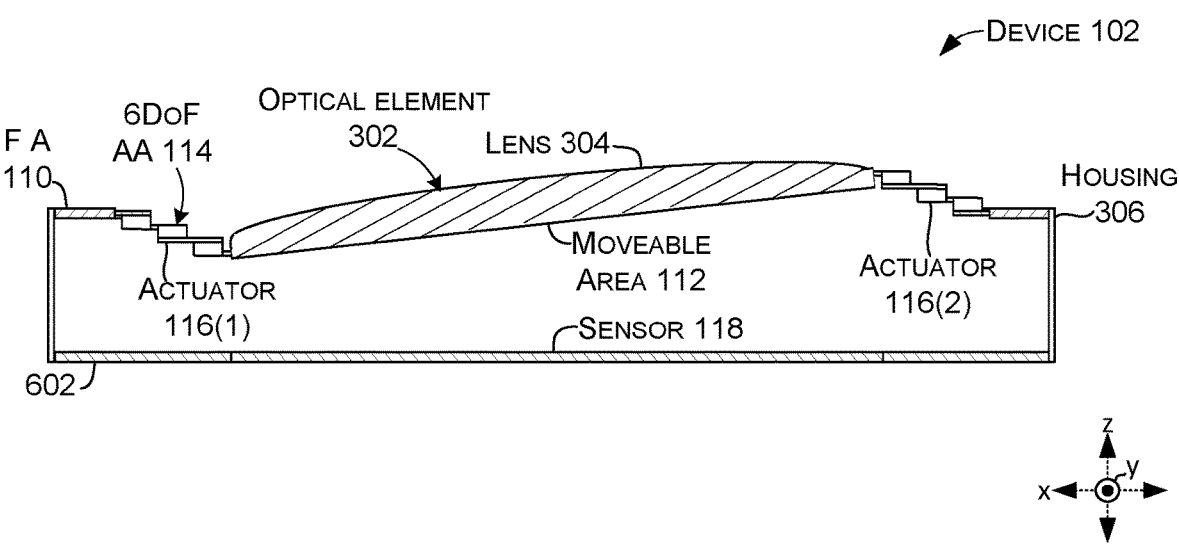
Figure 7:
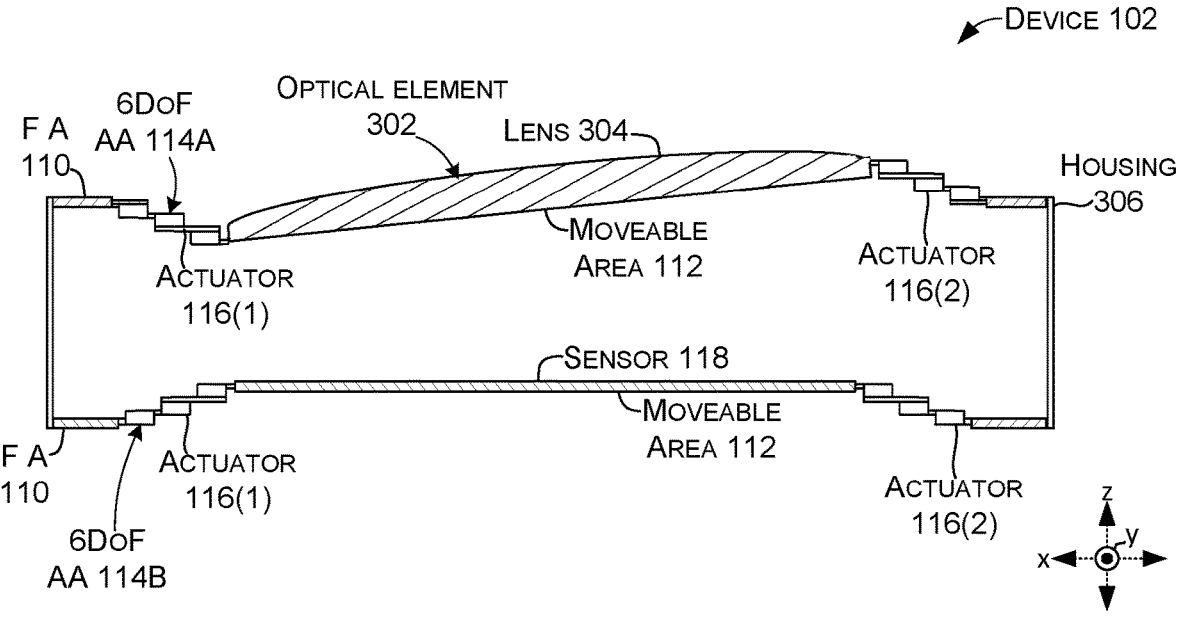

In the examples above, for ease of explanation, the 6DoF actuator assembly 114 has only been applied to move the sensor 118. However, such need not be the case. FIGS. 6 and 7 introduce two alternative example configurations.

FIG. 6 shows another example device 102. In this case, the sensor 118 is fixed in place relative to the housing 306. For instance, the sensor 118 can be positioned on a planar semiconductor substrate 602. In contrast, 6DoF actuator assembly 114 is secured between fixed area 110 and the optical element 302. Thus, the 6DoF actuator assembly 114 can move the lens 304 left and right, forward and backward, up and down, and rotate the lens relative to the sensor 118. The ability to move the lens relative to the sensor enhances image capturing performance of the device compared to a stationary lens.

TABLE 1

| Actuator | Shift Right (+X) | Shift Left (−X) | Shift Up (+Y) | Shift Down (−Y) | Rotate CCW | Rotate Clockwise |
|---|---|---|---|---|---|---|
| 116(1) | Extend | Retract | Neutral | Neutral | Retract | Extend |
| 116(2) | Retract | Extend | Extend | Retract | Extend | Retract |
| 116(3) | Neutral | Neutral | Retract | Extend | Retract | Extend |
| 116(4) | Neutral | Neutral | Extend | Retract | Extend | Retract |
| 116(5) | Retract | Extend | Retract | Extend | Retract | Extend |
| 116(6) | Extend | Retract | Neutral | Neutral | Extend | Retract |
| 116(7) | Retract | Extend | Neutral | Neutral | Retract | Extend |
| 116(8) | Extend | Retract | Retract | Extend | Extend | Retract |
| 116(9) | Neutral | Neutral | Extend | Retract | Retract | Extend |
| 116(10) | Neutral | Neutral | Retract | Extend | Extend | Retract |
| 116(11) | Extend | Retract | Extend | Retract | Retract | Extend |
| 116(12) | Retract | Extend | Neutral | Neutral | Extend | Retract |

The ability of the 6DoF actuator assembly 114 to move the sensor 118 provides a technical solution that can enhance image resolution of the sensor. The sensor 118 entails an array of pixels 502. Only four pixels arranged in a 2×2 array are shown here. In many implementations, the array will include thousands of pixels. Assume for purposes of expla- FIG. 7 shows another example device 102. This example device 102 includes two separate 6DoF actuator assemblies 114 that operate cooperatively to improve the optical performance of the device. The 6DoF actuator assembly 114A is positioned relative to the lens 304 as described relative to FIG. 6. The 6DoF actuator assembly 114B is positioned relative to sensor 118 as described relative to FIGS. 3-5. The technical solution offered by this configuration can provide enhanced optical performance compared to fixed devices. For example, in the illustrated configuration, the 6DoF actuator assembly 114A is tilting the lens 304 left, such as to capture an object of interest. Similarly, 6DoF actuator assembly 114B is moving the sensor 118 along the optical axis (e.g., the Z reference axis) to obtain the desired focal length between the lens 304 and the sensor 118. Thus, the cooperative operation of the two 6DoF actuator assemblies 114 can cause the lens 304 to be pointed at the object of interest by 6DoF actuator assembly 114A and can adjust the focal length to optimize the focus of the objected of interest by 6DoF actuator assembly 114B.

Note that while 6DoF actuator assemblies 114A and 114B can provide 6DoF movement, some implementations may achieve desired performance with less axes of linear and/or rotary movement. For instance, in the illustrated configuration of FIG. 7, 6DoF actuator assembly 114A could provide tilting of the lens 304 relative to the X reference axis and the Y reference axis and could entail fewer actuators 116. The 6DoF actuator assembly 114B associated with the sensor could include six or more actuators 116 and provide 6DoF movement. Thus, the term '6DoF actuator assembly' means that the actuator assembly can provide up to 6DoF movement.

Figures 8A, 8B:
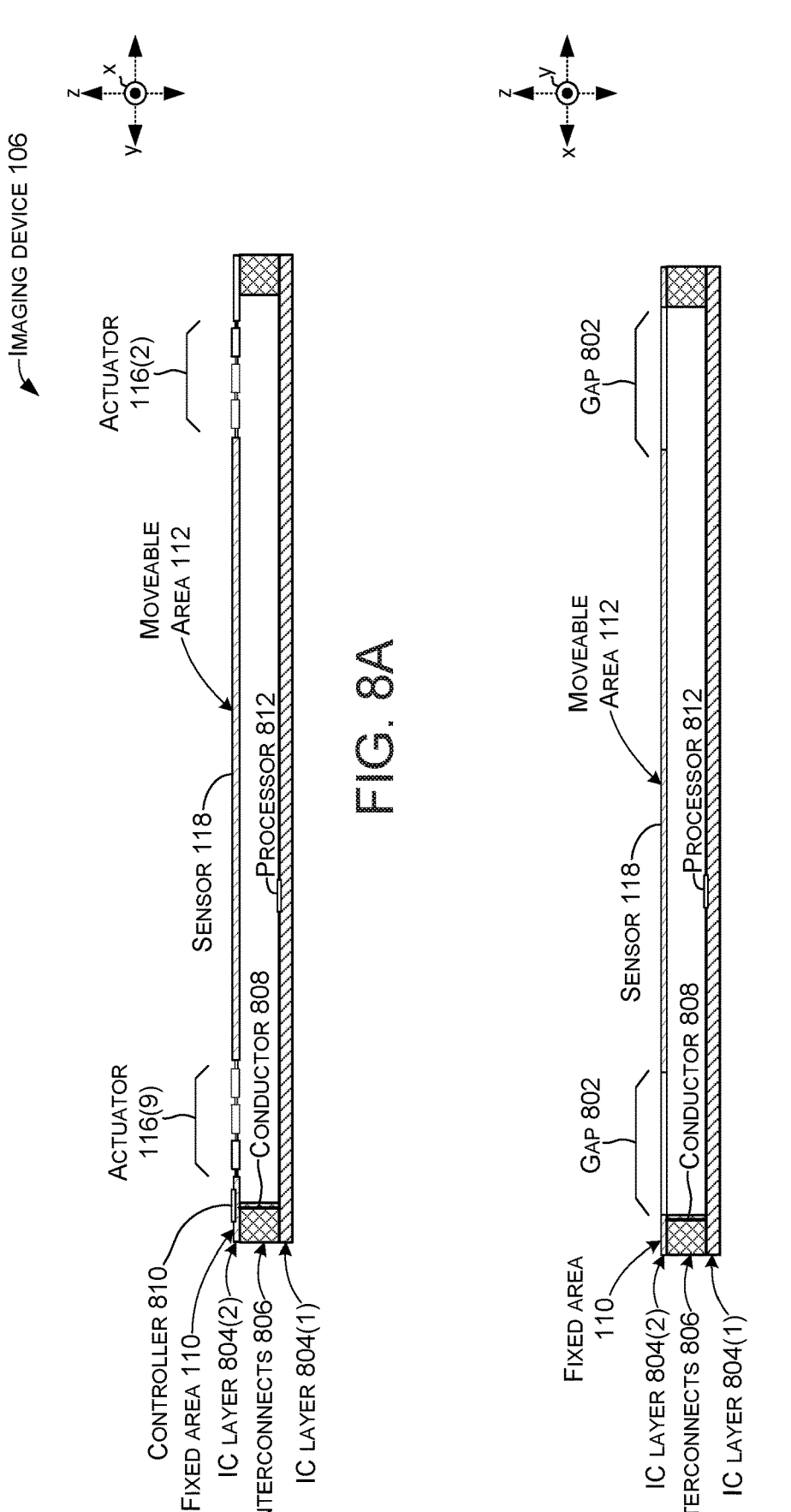

FIGS. 8A and 8B are sectional views of the imaging device 106 as indicated on FIG. 2A at Instance Two. The optical element 302, which is shown in FIGS. 3, 6, and 7 is not shown in these views. FIG. 8A is taken along the YZ reference plane and FIG. 8B is taken along the XZ reference plane. As described above, the imaging device 106 can include actuators 116 that extend between the fixed area 110 and the moveable area 112. This configuration provides a technical advantage in that it produces a thinner device than existing solutions positioned under (in the Z reference direction) the moveable area 112. This configuration also provides a technical advantage that the actuators 116 both convert electrical or magnetic energy into mechanical energy to move the moveable area 112 and provide a path for conductors from the fixed area 110 to the moveable area 112. The sectional view of FIG. 8A is slightly off center and passes through actuators 116(2) and 116(9). The sectional view of FIG. 8B does not pass through any actuators and instead passes through gaps 802 between adjacent actuators.

FIGS. 8A and 8B show a stacked configuration where the imaging device 106 is positioned over an integrated circuit (IC) layer 804(1). Interconnects (e.g., interposers) 806 separate the imaging device 106 from the integrated circuit layer 804(1). Conductors 808 (e.g., sensor conductors) can extend along interconnects 806 to electrically couple the imaging device and the circuit layer. In this implementation, the integrated circuit layer 804 can be formed from a single semiconductor substrate that has been processed to produce the integrated circuit layer 804(1). The fixed area 110, actuators 116, and moveable area 112 can be processed from another semiconductor substrate that has been processed into a second integrated circuit layer 804(2). Interconnects 806 physically separate the two integrated circuit layers 804(1) and 804(2) and provide electrical connections via conductors 808.

One example configuration involves integrated circuits, in the form of an actuator controller 810 and processors 812. In the illustrated two-layered or stacked configuration, the actuator controller 810 is located on the fixed area 110 of IC layer 804(2) that is dedicated to powering, controlling, and communicating with the actuators 116. Integrated circuits, including processors 812, such as graphical processing units (GPUs), visual processing units VPUs), and/or neural processing units (NPUs) can be positioned on the IC layer 804(1) for performing real time image processing on the pixel data from the sensor 118. Other circuitries such as power management units can handle powering, controlling, and communicating with the sensor 118. This vertically stacked imaging device 106 can be considered a stacked system on a chip (SoC). The stacked SoC provides a technical advantage that saves device real estate in the X and Y reference directions as compared to a single layer that includes all of the integrated circuits.

Figure 9:
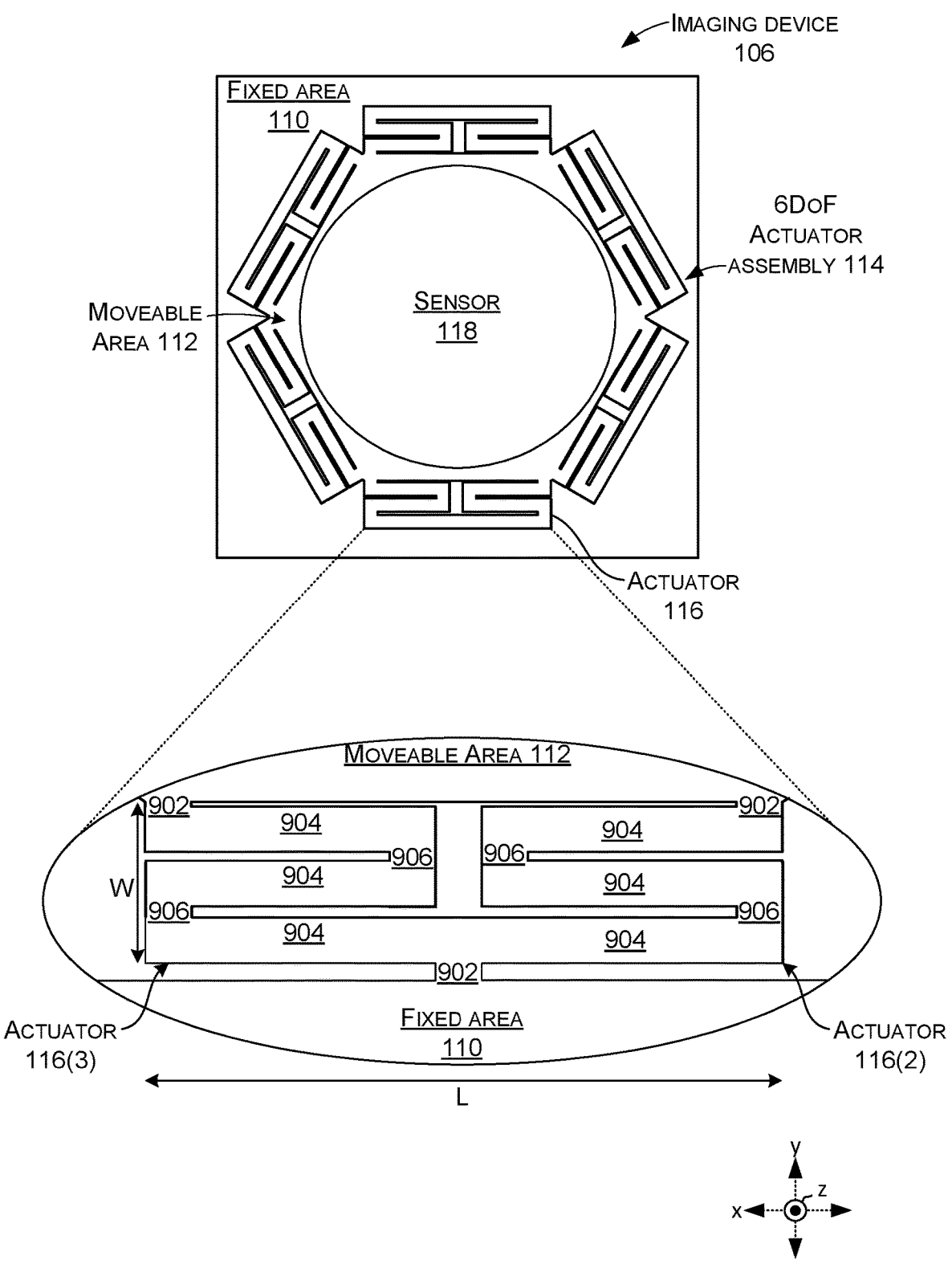

FIG. 9 shows another example imaging device 106 and shows additional details of two individual actuators 116(2) and 116(3). The actuators 116 are coupled to the fixed area 110 and the moveable area 112 by hinge or joint portions 902. Only a portion of the fixed area 110 and the moveable area 112 are shown. The actuators 116 include alternating elongate portions 904 and switchback-shaped transition portions 906. The switchback-shaped transition portions 906 can be rectangular shaped, V-shaped, and/or U-shaped, among others. The actuators 116 can be viewed as a planar ribbonlike structure that can be controlled to change its dimensions, such as, width and/or length, to change its shape, such as by bending out of the plane, and/or to rotate out of the XY reference plane. Examples are described above relative to FIGS. 2A, 2B, 3, 4, and 5. When operated cooperatively, the physical changes to the actuators 116 can move the moveable area 112 relative to any of up to 6DoF. Moving the moveable area (and the sensor 118) can enhance device performance by capturing images that are in better focus and/or are centered on objects of interest, among other advantages.

Figures 10, 11:
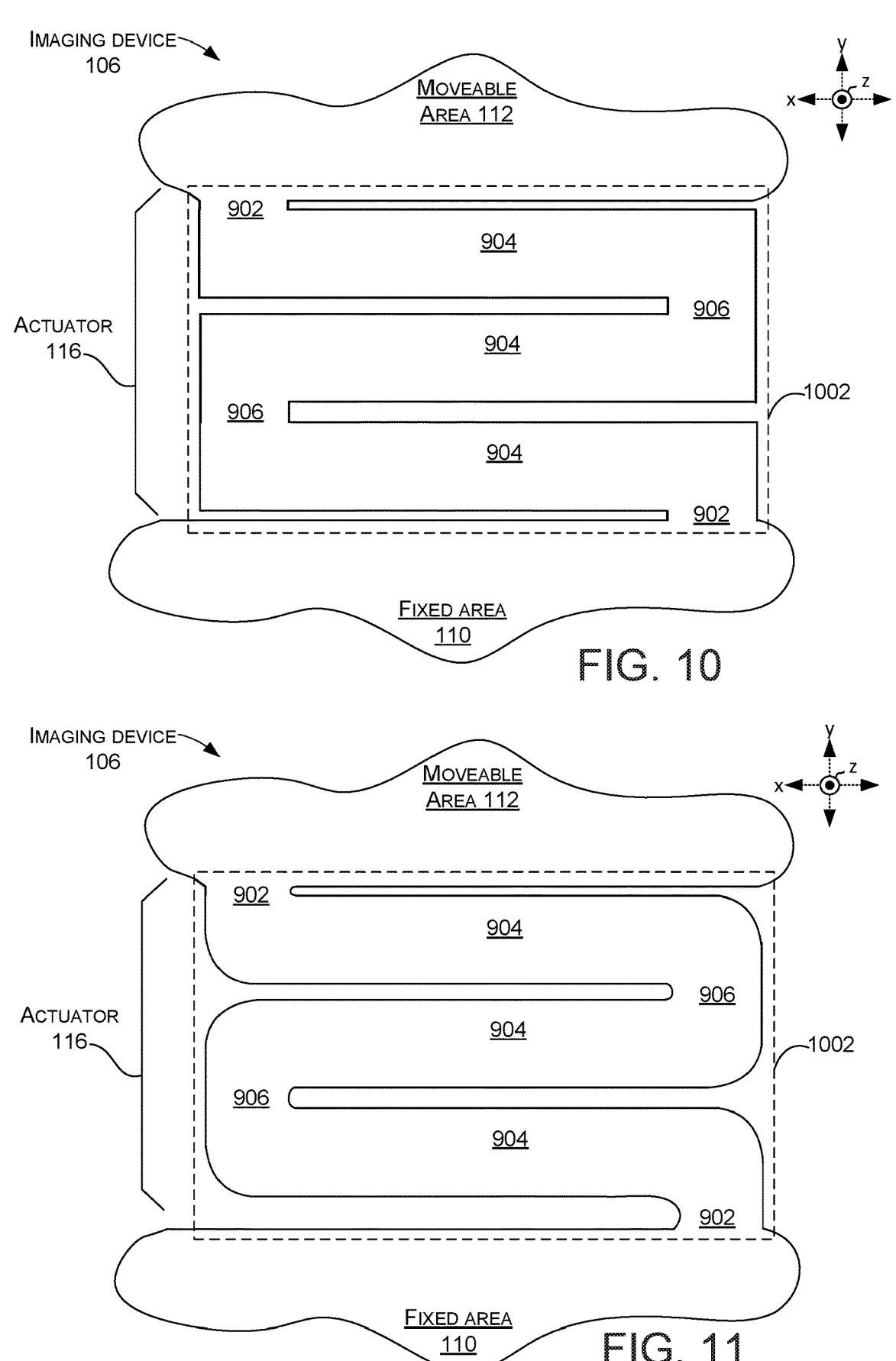
Figure 12:
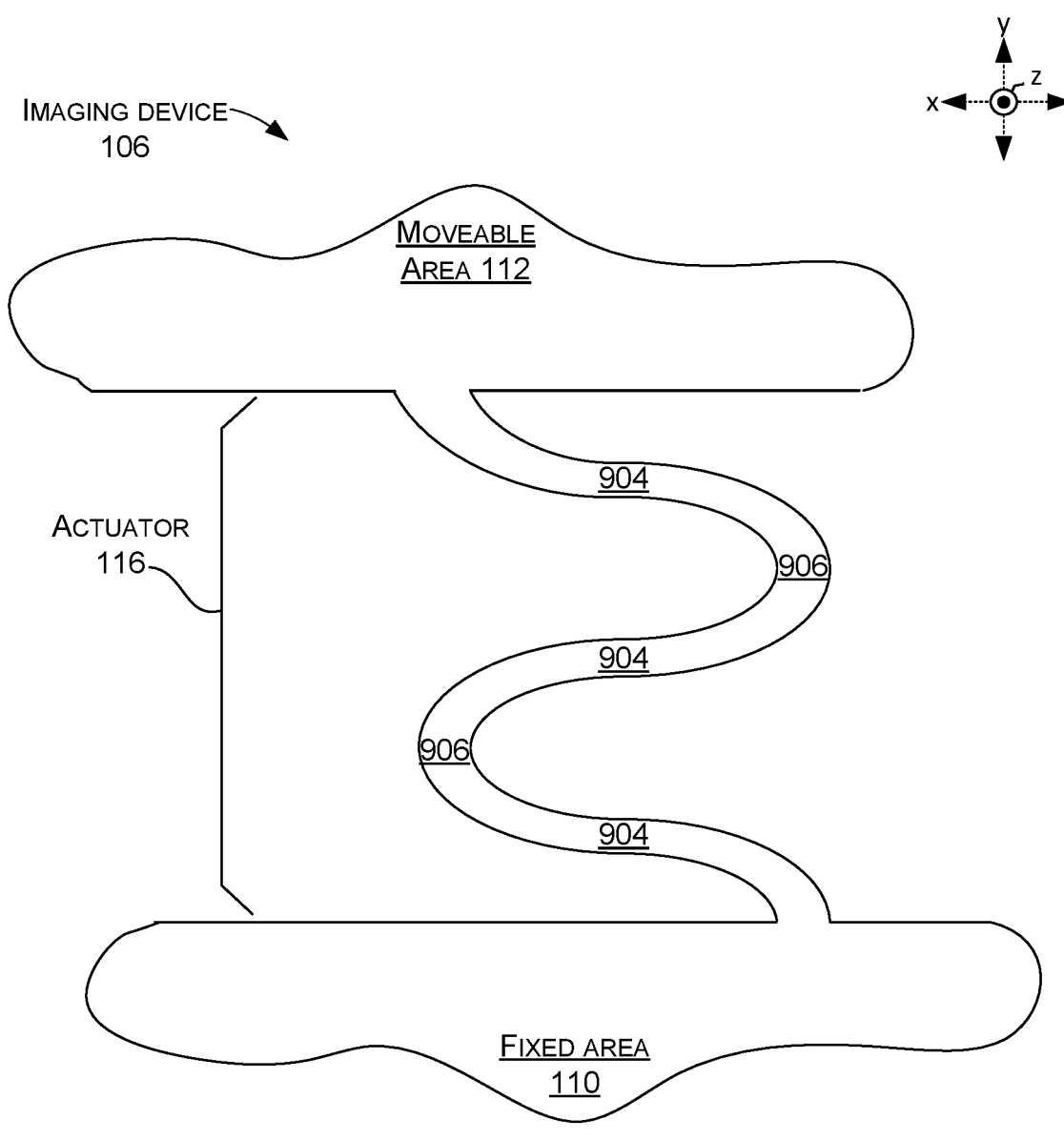

FIGS. 10-12 show details of another example imaging devices 106 relating to actuators 116.

FIG. 10 shows a configuration with rectilinear switchback-shaped transition portions 906 connecting linear elongate portions 904. The actuator 116 connects to the moveable area 112 and the fixed area 110 via hinge portions 902. A perimeter of the actuator 116 approximates a rectangle or rectangular shape 1002.

FIG. 11 shows an actuator 116 configuration that is similar to FIG. 10. In this case, the elongate portions 904 are linear, but the switchback-shaped transition portions 906 are curvilinear; in this case U-shaped. The overall perimeter of the actuator 116 continues to approximate a rectangle or rectangular shape 1002.

FIG. 12 shows an actuator 116 configuration where both the elongate portions 904 and the switchback-shaped transition portions 906 are curvilinear. FIGS. 10-12 show example actuator shape configurations and other shapes are contemplated.

FIGS. 13-20 show aspects of example imaging devices 106. These FIGS. explain example configurations for controlling individual actuators 116. These actuators 116 are built into the substrate using MEMS fabrication processes. Motion in these actuators can be achieved using different means of conversion from electrical to mechanical energy (e.g., actuation elements), including piezoelectric, thermal, electrostatic, and/or electromagnetic. The actuators achieve this functionality through a technical solution involving compliant mechanisms and transformable materials. Several actuation element configurations are described below.

Figure 13:
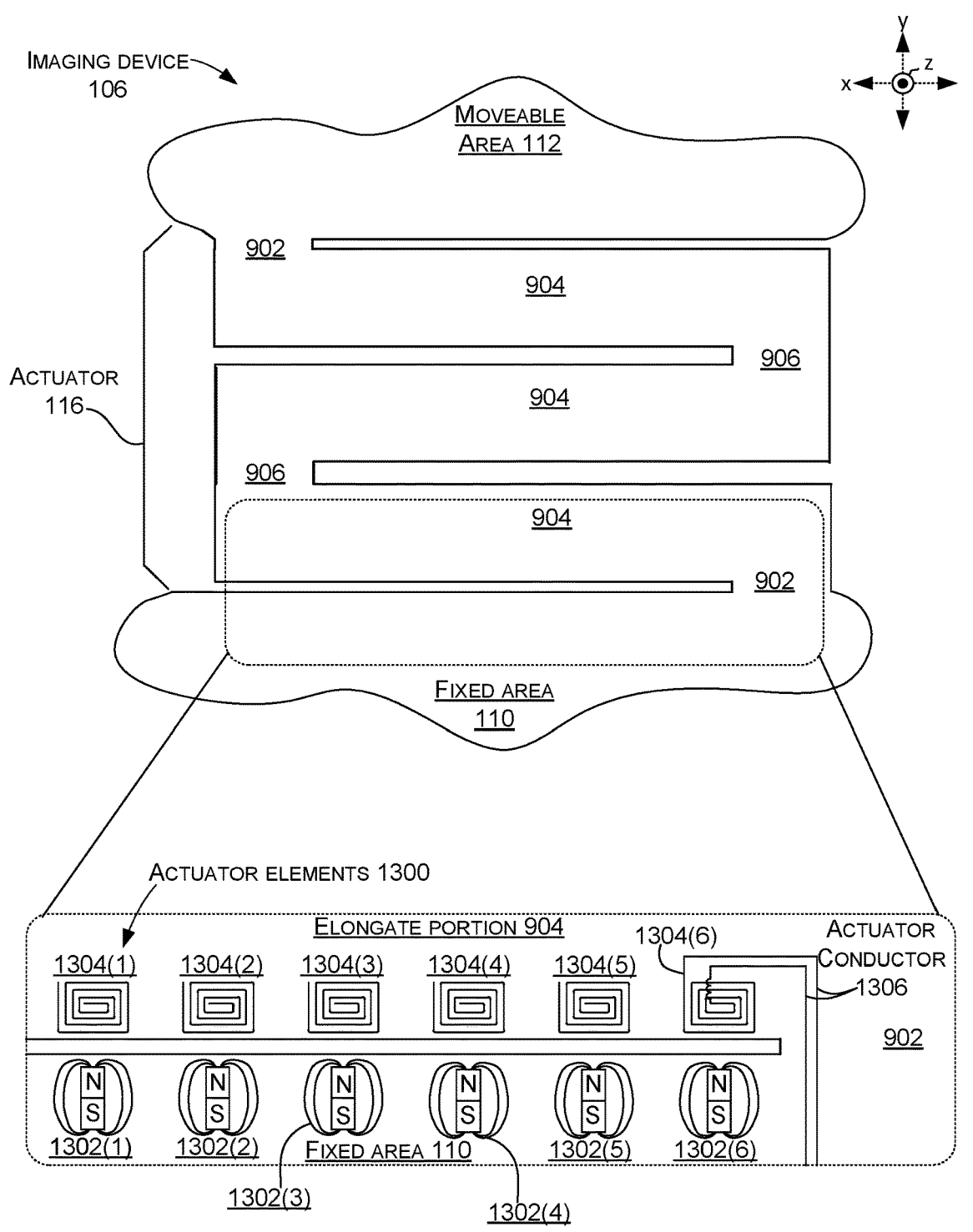

FIG. 13 shows an example for moving and controlling the individual actuators 116 with actuator elements 1300. In this case, the actuator elements 1300 include permanent magnets 1302 and electric coils 1304. In this example the permanent magnets 1302 are formed in the fixed area 110 proximate to the actuator 116. Electric coils 1304 are formed in the actuator 116 proximate to the permanent magnets 1302. The electric coils 1304 can be powered via conductors 1306. The power conveyed through the conductors 1306 to the electric coils 1304 can be controlled by the actuator controller 810 of FIG. 8. To avoid clutter on the drawing page the conductors 1306 are only shown relative to electric coil 1304(6). The permanent magnets 1302, electric coils 1304, and conductors 1306 can be formed as part of the semiconductor processing.

The electric coils 1304 can be controlled to affect the position and orientation of the actuator 116 relative to the fixed area 110. For instance, in the unpowered state, the permanent magnets 1302 (e.g., the magnetic field produced by the permanent magnets) has no effect on the electric coils 1304 and the actuator 116 maintains the neutral or planar position (e.g., the actuator remains in the XY reference plane with the fixed area 110 and the moveable area 112). This default to the planar configuration can provide a technical advantage of power savings in that no power is expended until a scenario is encountered where there is an advantage to move the moveable area 112 to another orientation. When the power is removed the actuators and hence the moveable area 112 return to the default planar configuration.

Figure 14:
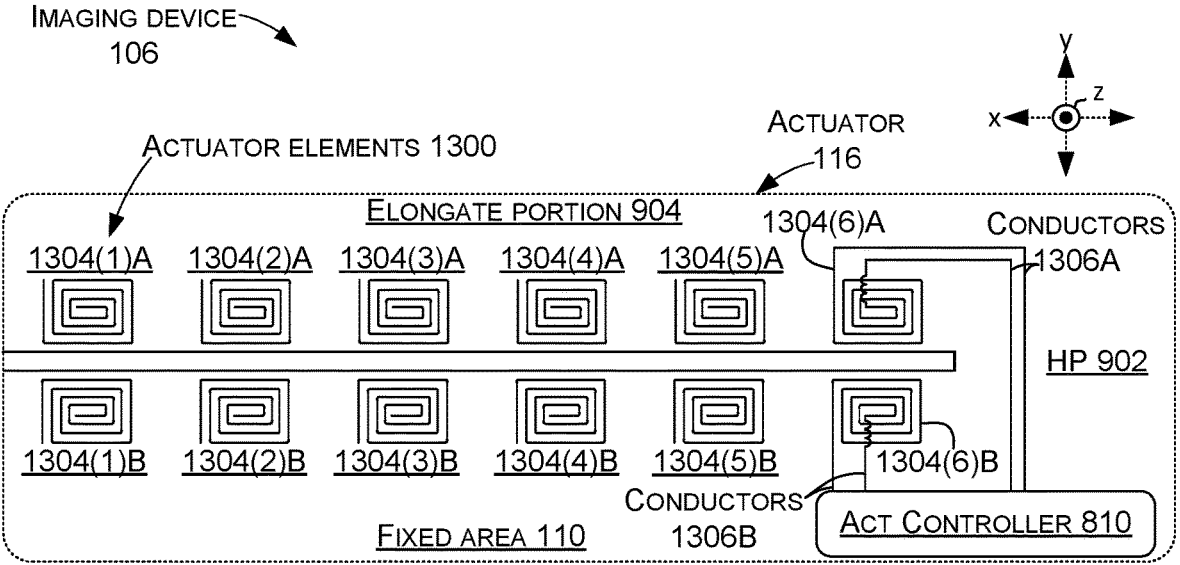

Powering the electric coils 1304 in one direction (e.g., '+' to the inside of the coil as depicted and '−' to the outside of the coil as depicted) will cause the coil to create a magnetic field that will interact with the magnetic field of the adjacent permanent magnet 1302. This electrical field interaction will create a force that will move the actuator 116 up or down relative to the XY reference plane. If the polarity of the control power is switched (e.g., '−' to the inside of the coil as depicted and '+' to the outside of the coil 1304 as depicted), the direction of the force exerted on the actuator 116 will switch (e.g., from down to up or from up to down). The amplitude of the force (and hence the deflection of the actuator) can be controlled based upon the power supplied to the electric coils 1304. This implementation can be viewed as an electromagnetic actuator control version. FIG. 14 introduces an alternative actuator control configuration.

FIG. 14 shows another imaging device 106. FIG. 14 shows less than the entirety of the actuator 116. In a similar fashion to FIG. 13 only a section of the elongate portion 904 and the fixed area 110 are shown. In this configuration, the actuator elements 1300 include electric coils 1304 formed in both the elongate portion 904 of the actuator 116 and the fixed area 110.

Conductors 1306 extend from both sets of electric coils 1304A and 1304B to actuator controller 810. (As with FIG. 13, only one set of conductors is shown to avoid clutter on the drawing page.) The adjacent coils 1304 in the elongate portion 904 and the fixed area 110 can be controlled to create electrodynamic forces. For instance, if adjacent coils are powered with like polarity, opposing magnetic fields can be created to move or deflect the elongate portion 904 in one direction. If the adjacent coils are powered with opposite polarity, the elongate portion 904 will deflect in the opposite direction. As with FIG. 13, powering the coils 1304 with higher power levels creates greater deflective forces.

FIGS. 15A-15C collectively show another implementation of imaging device 106. In this case, actuator elements 1300 include piezoelectric elements 1502 in actuator 116. The piezoelectric elements 1502 include a piezoelectric crystal 1504 interposed between two substrates 1506. FIG. 15A is an elevational view of the imaging device taken along the Z reference axis. FIG. 15B is a sectional view through the elongate portion 904 along the XY reference plane as indicated in FIG. 15A. In FIGS. 15A and 15B, piezoelectric crystal 1504 is not being powered and is in a neutral planar configuration.

FIG. 15C is the same view as FIG. 15B, but shows the piezoelectric crystal 1504 being actuated by power from actuator controller 810 via conductors 1306. The electrical energy causes physical deformation of the piezoelectric crystal 1504 and thus the elongate portion 904. The power can be varied to control the amplitude of deflection of the piezoelectric crystal 1504. The polarity of the control power can be switched to cause the piezoelectric crystal 1504 to deform in the opposite direction (e.g., down instead of up).

Figures 16A, 16B, 16C:
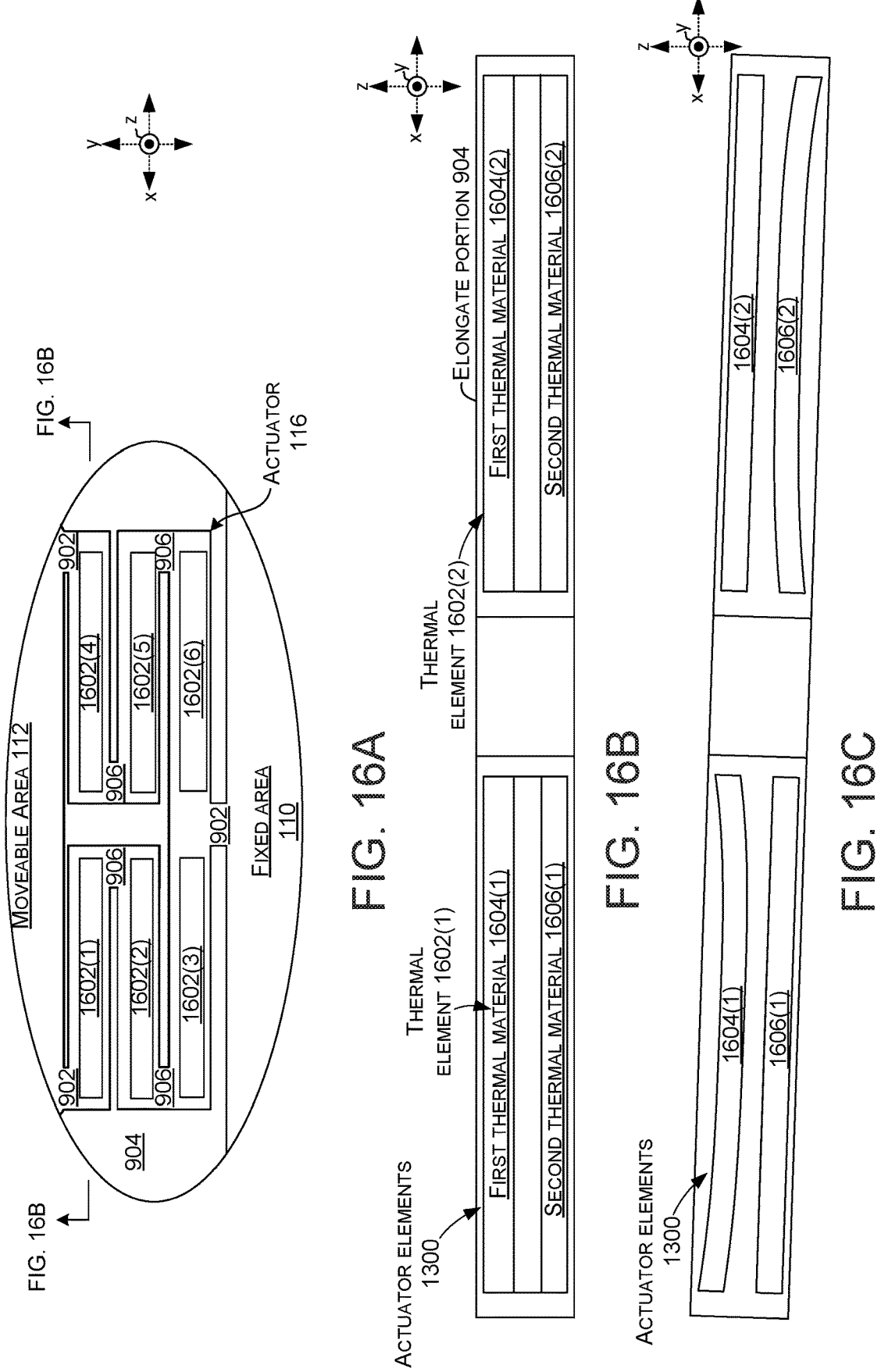

FIGS. 16A-16C collectively show another implementation of imaging device 106. In this implementation actuator elements 1300 include thermal elements 1602 in actuator 116. Thermal elements 1602(1) have first and second thermal materials 1604 and 1606 that have different coefficients of thermal expansion compared to one another. The thermal elements 1602 can be generally planar unless they are energized by the actuator controller (discussed above). Energizing individual thermal elements causes them to expand and creates forces on the actuator 116 and ultimately the moveable area 112.

FIG. 16B is a sectional view as indicated in FIG. 16A in the resting or neutral state. FIG. 16C is a similar view to FIG. 16B. In this case, first thermal material 1604(1) and second thermal material 1606(2) have been activated. This can create an upward force on the left side of the actuator 116 and a downward force on the right side of the actuator. The actuator 116 can transfer these forces through the hinge portions 902 to the moveable area 112 to cause tilting of the moveable area 112 (FIG. 16C is tilted a few degrees to the right compared to FIG. 16B). This tilting is also rotation around the y reference axis.

Figure 17A:
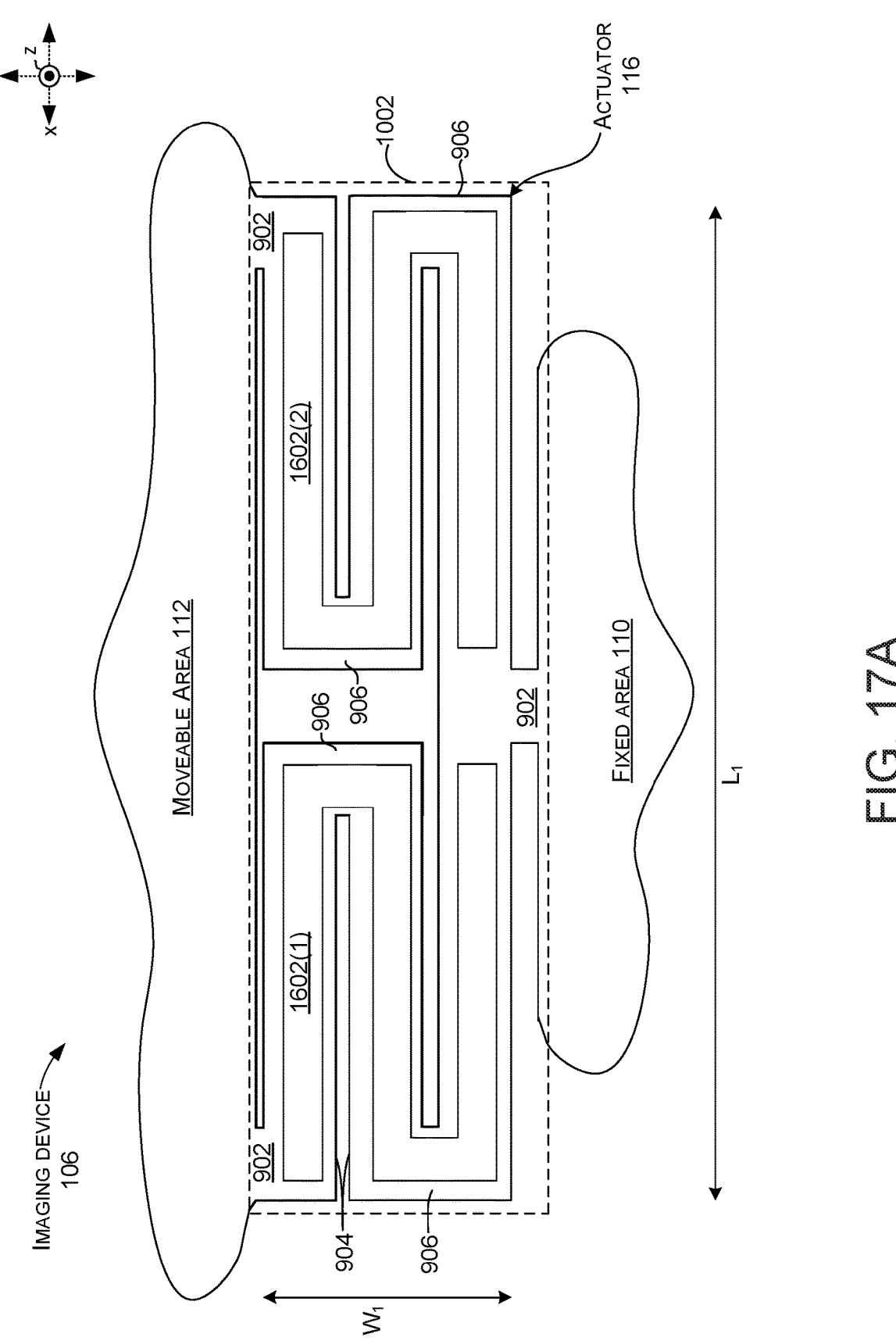
Figure 17B:
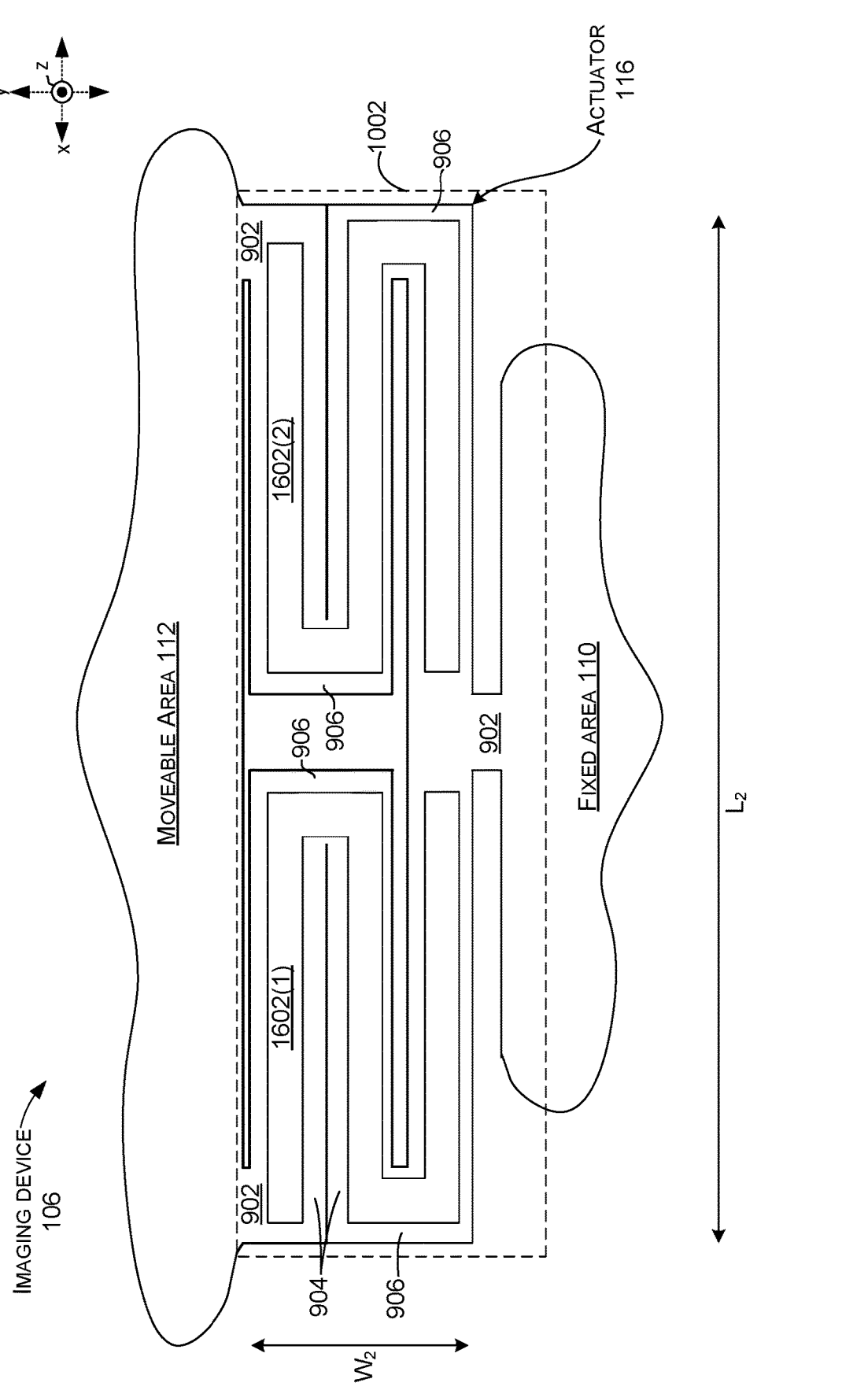

FIGS. 17A and 17B collectively show another actuator configuration on example device 106. In this case, thermal elements 1602 traverse from elongate portion 904, across switchback-shaped transition portions 906 over elongate portion 904, switchback-shaped transition portions 906, and over elongate portion 904. Energizing the thermal elements can change the shape of the actuator 116. In this case, the actuator has a rectangular shaped perimeter 1002. FIG. 17A shows the actuator in the resting or neutral configuration.

FIG. 17B shows the thermal elements 1602(1) and 1602(2) both energized with the same power and polarity. The actuator 116 maintains the rectangular shaped perimeter when energized, but in this case, the width W decreases from $W_1$ of FIG. 17A to $W_2$ of FIG. 17B. In some implementations, the length $L_1$ will increase to length $L_2$ when the width decreases from $W_1$ to $W_2$. The thermal elements 1602(1) and 1602(2) could be energized with opposite polarity to create a twisting force on the moveable area 112 (e.g., to create tilting of the moveable area 112). Further, while thermal elements are illustrated here, other actuator element types, such as piezoelectric elements can be employed.

FIGS. 18A and 18B collectively show another example imaging device 106. In this case, the imaging device can be formed by processing a single semiconductor substrate (e.g., insulative semiconductor substrate 1802). FIG. 18B shows a cross-section through the actuator 116 as indicated in FIG. 18A. The processing can entail removing and depositing layers of materials. In this case, conductive traces including sensor conductors 808 and actuator conductors 1306 can be formed on the substrate. In this example, the sensor conductors 808 include a data conductor (D), power conductor (P), control conductor (C), and ground conductor (G). The actuator conductors 1306 include a power conductor (P) and ground conductor (G). Insulative material 1804 can be formed around the conductors. Actuator elements 1300 can be formed over the insulative material 1804. Example actuator elements 1300 including piezoelectric element 1502 (FIGS. 15B and 15C) and thermal element 1602 (FIGS. 16A-16C) are described above. Other actuator element examples include electric coils 1304 of FIGS. 13 and 14. An insulative layer 1808 can be formed over the actuator element 1300.

Note that this implementation provides a technical solution in that the actuator 116 both provides movement to the moveable area 112 and hence the sensor 118, and also includes conductors 808 that carry signal between the sensor 118 and the fixed area 110 and ultimately to other integrated circuits, such as processors. While a single set of conductors 808 is shown here, a single actuator 116 can accommodate more conductors and the conductors can be distributed across the multiple actuators 116.

FIGS. 19A, 19B, and 20 collectively show details about the physical or geometric shape of example actuators 116. FIGS. 19A and 19B introduce the concept that flexures 1902 can be employed to promote bending in specific areas of the actuators 116. The flexures 1902 are shown as dotted lines on FIGS. 19A and 19B. To avoid clutter on the drawing page, not all of the flexures are specifically labelled. Flexures 1902 can be manifest in different ways. One type of flexure entails physically thinning the actuator material to promote bending. Another type of flexure entails doping or otherwise changing the composition of the actuator material. For instance, the actuator material may have a configuration that is relatively stiff. Flexures can be formed by doping the actuator material to produce a material that is more compliant (e.g., less stiff) and prone to bending.

As introduced above, the actuators 116 can be ribbon-like semiconductor structures that are generally planar unless they are energized. The actuators 116 function as transformable metamaterials in that when energized with electrical or magnetic energy they mechanically change dimensions and/ or become non-planar. The flexures 1902 cause the actuators to function as compliant mechanisms that enable linear and rotary motion in multiple degrees of freedom without the need for joints.

FIG. 19A shows a configuration where actuators 116(1) and 116(2) have separate hinge portions 902 at the fixed area 110. The two actuators share a common hinge portion 902 at the moveable area 112. Flexures 1902 are formed at each hinge portion 902 and each transition portion 906. In this case, multiple flexures 1902 are formed at each hinge portion and each transition portion. The flexures 1902 facilitate desired and repeatable bending of the actuator 116 when the activation elements (discussed above) are energized.

FIG. 19B shows a configuration where actuators 116(1) and 116(2) have centrally positioned but separate hinge portions 902 at the fixed area 110. The two actuators 116(1) and 116(2) have separate and distally positioned hinge portions 902 at the moveable area 112. Flexures 1902 are formed at each hinge portion 902 and transition portion 906. In this case, three flexures 1902 are formed at each hinge portion 902 and transition portion 906. The flexures 1902 can facilitate desired and repeatable bending of the actuator 116 when the activation elements (discussed above) are energized.

FIG. 20 shows actuator 116(1) of FIG. 19B energized to bend out of the planar configuration of FIG. 19B. The left side of the drawing page shows extension 2002 of the actuator 116(1) and the right side shows retraction 2004 of the actuator 116(1). (Note that the reference perspective is rotated 180 degrees between the extension 2002 and retraction 2004 views). Retraction 2004 is achieved by energizing the actuator 116(1) with the same power as extension 2002, but with the opposite polarity. The flexures 1902 facilitate bending of the actuator 116 along a desired geometry.

From one perspective, when the actuator 116 is energized the flexures in the transition portions 906 cause bending of the elongate portions 904. The bending of the elongate portions 904 results in linear motion orthogonally to the elongate portions. Depending on the polarity of the applied voltage, this motion results in expansion or retraction of the actuator.

Several example imaging device implementations have been described in detail above relating to physical shape of the moveable area 112, placement and number of actuators 116, etc. FIGS. 21-24 show several additional implementations. These implementations can provide at least 3DoF (rotation around the X axis, rotation around the Y axis, and Z displacement motion).

Figure 21:
Figure 21:
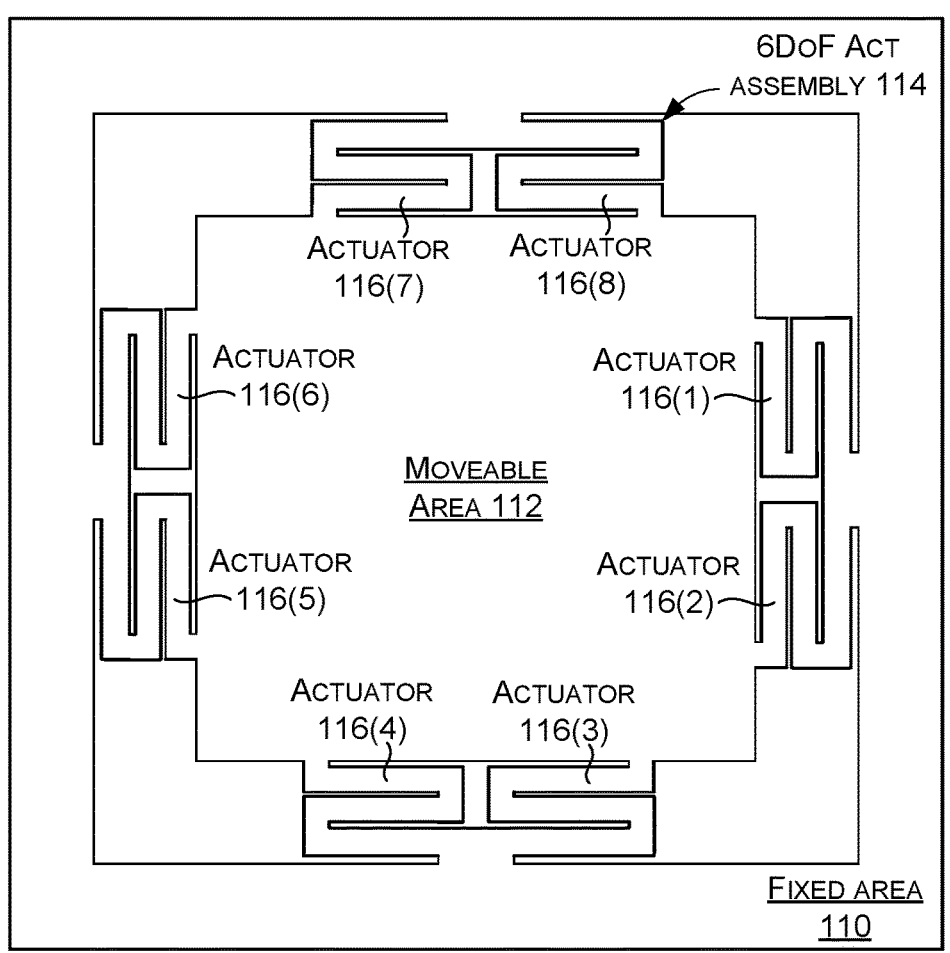

FIG. 21 shows an example imaging device 106 that includes a rectangular (in this case square) moveable area 112. Eight actuators 116(1)-116(8) are arranged along the sides of the rectangle and coupled between the fixed area 110 and the moveable area 112. In this case, the eight actuators are arranged as four pairs with each pair positioned on a side of the rectangular moveable area 112. In an alternative configuration, a single actuator could be positioned along each side.

Figure 22:
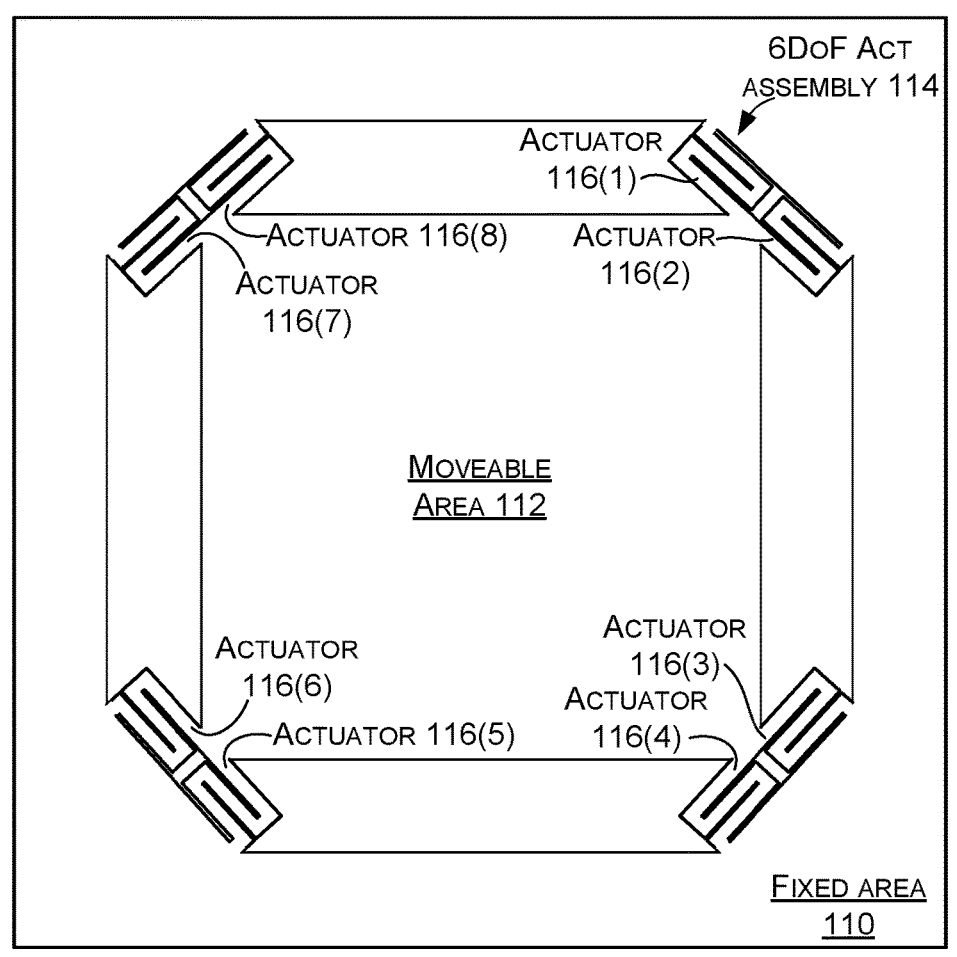

FIG. 22 shows another example imaging device 106 that includes a rectangular moveable area 112. Eight actuators 116(1)-116(8) are arranged along the corners of the rectangle and coupled between the fixed area 110 and the moveable area 112. In this case, the eight actuators are arranged as four pairs with each pair positioned on a corner of the rectangular moveable area 112. In an alternative configuration, a single actuator could be positioned at each corner.

Figure 23:
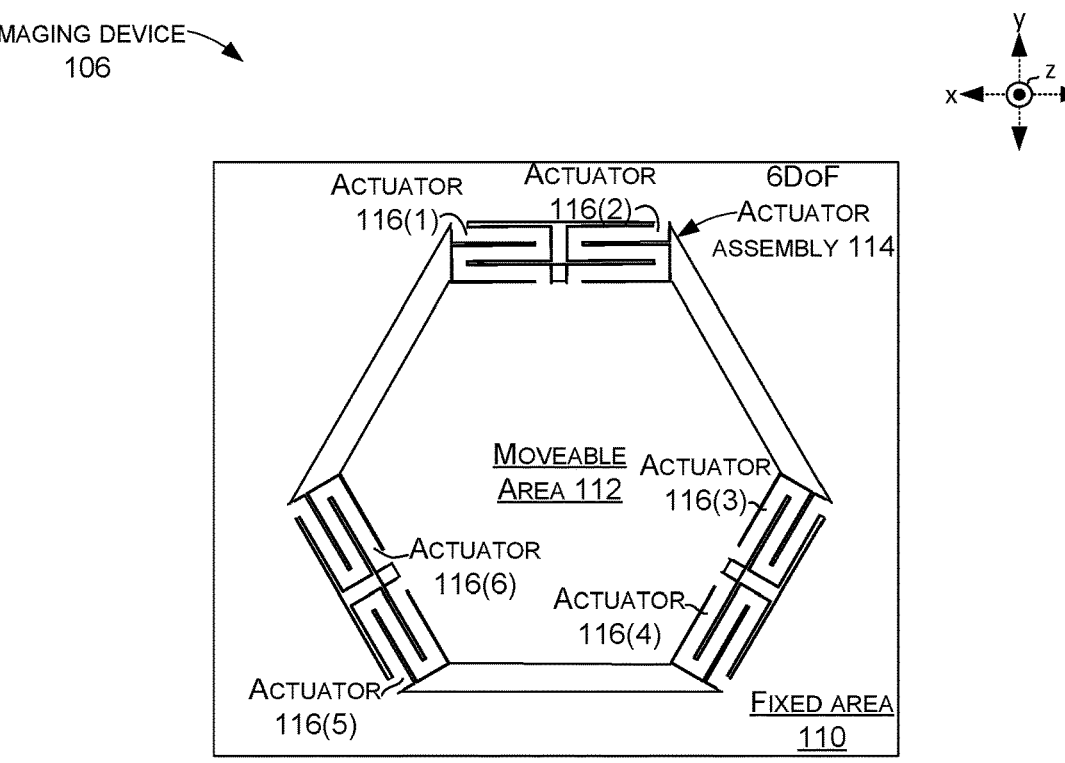

FIG. 23 shows another example imaging device 106 that includes a hexagonal moveable area 112. Six actuators 116(1)-116(6) are arranged in pairs along every other side of the moveable area 112 (e.g., in a triangular arrangement). In this case, the six actuators are arranged as three pairs with each pair positioned on a corner of the rectangular moveable area 112.

Figure 24:
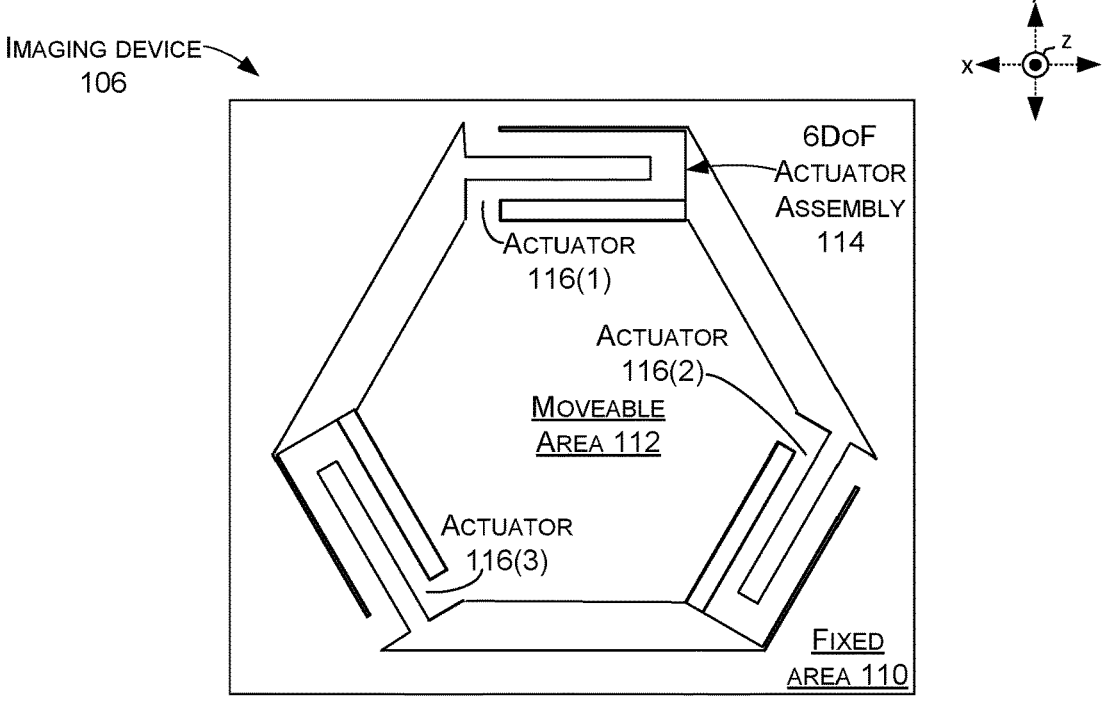

FIG. 24 shows another example imaging device 106 that includes a hexagonal moveable area 112. Three actuators 116(1)-116(3) are arranged along every other side of the moveable area 112 in a triangular arrangement.

Figure 25:
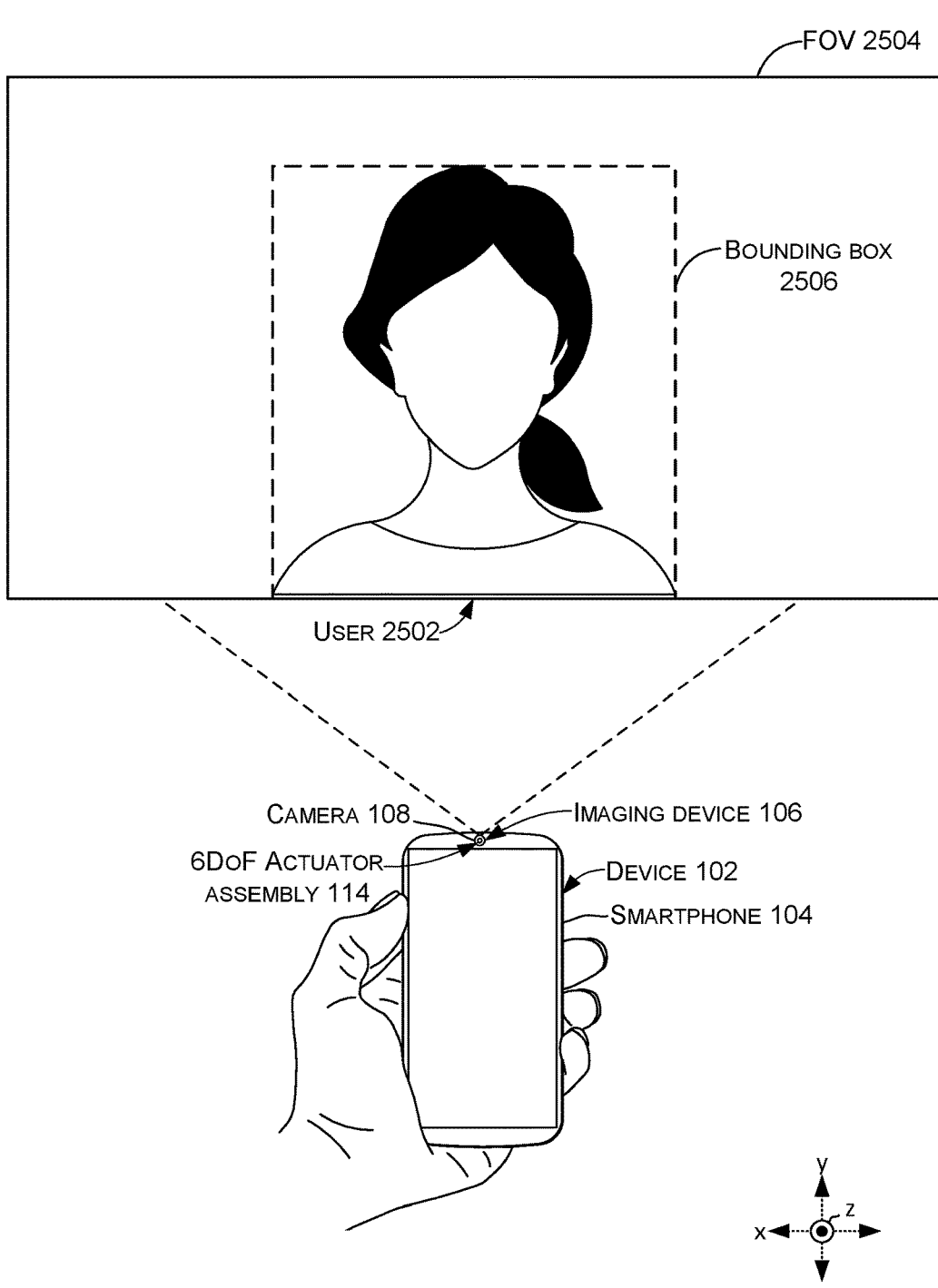
FIGS. 25 and 26 show example use-case scenarios in accordance with some implementations of the present concepts.

FIG. 25 shows a use-case scenario 2500 involving device 102 that includes a camera 108. The camera 108 includes 6DoF actuator assembly 114. The use-case scenario can relate to a single user or multiple users.

One scenario consists of a single user, such as a teleconference participant in front of the camera. In this scenario, a user 2502 tends to occupy an area of the Field of View (FOV) 2504 with a 1:1 aspect ratio bounding box 2506. The bounding box 2506 is horizontally centered and occupies between ⅓ and ½ of the FOV width. The bounding box 2506 occupies between ⅔ and ¾ of the bottom section FOV height. Content inside the bounding box tends to be in constant motion. This moving content mostly relates to the user's speech and gestures. The content outside the bounding box tends to be static and is mostly background, such as the user's home or office background.

A second use-case scenario involves a hybrid teleconference. In hybrid teleconferences more than one participant is expected to be on camera when speaking. For this scenario, an extended FOV across the horizontal axis is highly desirable. The present concepts can accommodate the broad field of view by tilting left and right.

A third scenario involves a family teleconference. This scenario has more participants, including adults and children, in standing and sitting positions. For this scenario, extension of the FOV across both horizontal and vertical axes, as well as extension of the depth of field is highly desirable.

Figure 26:
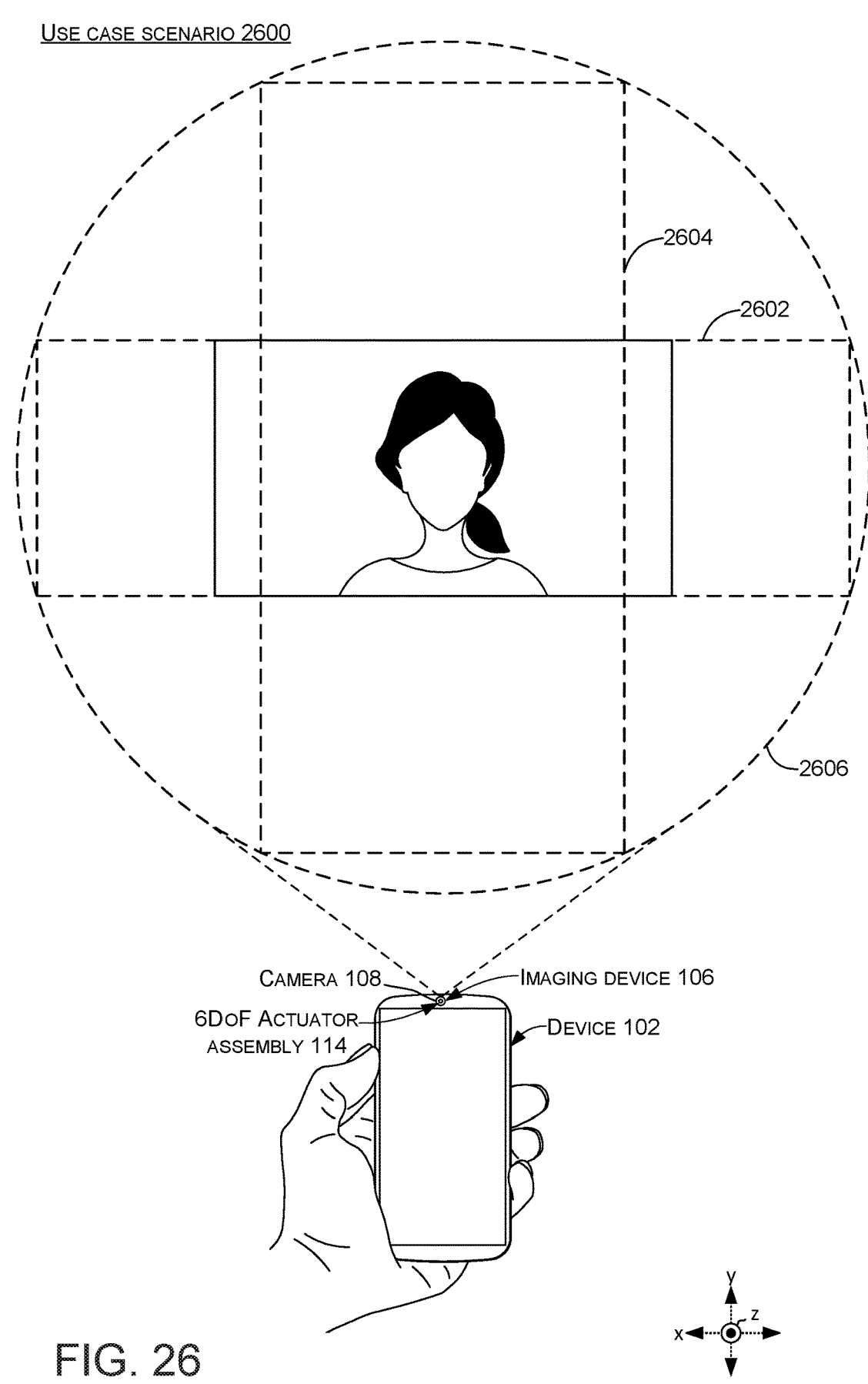

FIG. 26 shows use-case scenario 2600 with an extended field of view across the horizontal and vertical axes. Horizontal and vertical rectangles 2602 and 2604 corresponding to extended horizontal and vertical FOVs respectively can be enclosed in a circle (circumscribed) as denoted by "enclosed circle" 2606.

The device 102 employing camera 108 with 6DoF actuator assembly 114 can accomplish the above-mentioned use-case scenarios. The 6DoF actuator assembly 114 provides a technical solution by enabling advanced imaging functionalities that are not available in consumer-grade cameras, including all functionalities listed above. The technical solution provides these enhanced functionalities at a cost that is consistent with existing consumer-grade camera modules like the ones used in laptops and smartphones.

In the first use-case scenario described above relating to a single user, less than one half of the FOV tends to be occupied by the user and has motion, with the remaining area occupied by the background being predominantly static.

In some operational scenarios, the 6DoF actuator assembly 114 can regularly pan and tilt (a process called "scanning") across the entire attainable vertical and horizontal ranges. By applying image stitching and other image processing techniques (including machine learning-enhanced techniques), a static FOV approximately three times larger than the sensor FOV is attainable while maintaining high image resolution.

In addition to extended FOV, this type of operation enables a "tracking shot" visual effect. Tracking shot is a cinematography technique where the camera follows ("tracks") the user, maintaining them always centered despite being in motion.

For the second use-case scenario involving the hybrid teleconference and the third use-case scenario involving a family teleconference the present 6DoF actuator assembly 114 can provide an extended FOV with motion in the background (e.g., more than one person in front of the camera). The extended FOV also can be updated in real time by the 6DoF actuator assembly 114 directing the sensor toward different objects of interest (e.g., users) and then the processors stitching together multiple images.

Figure 27A:
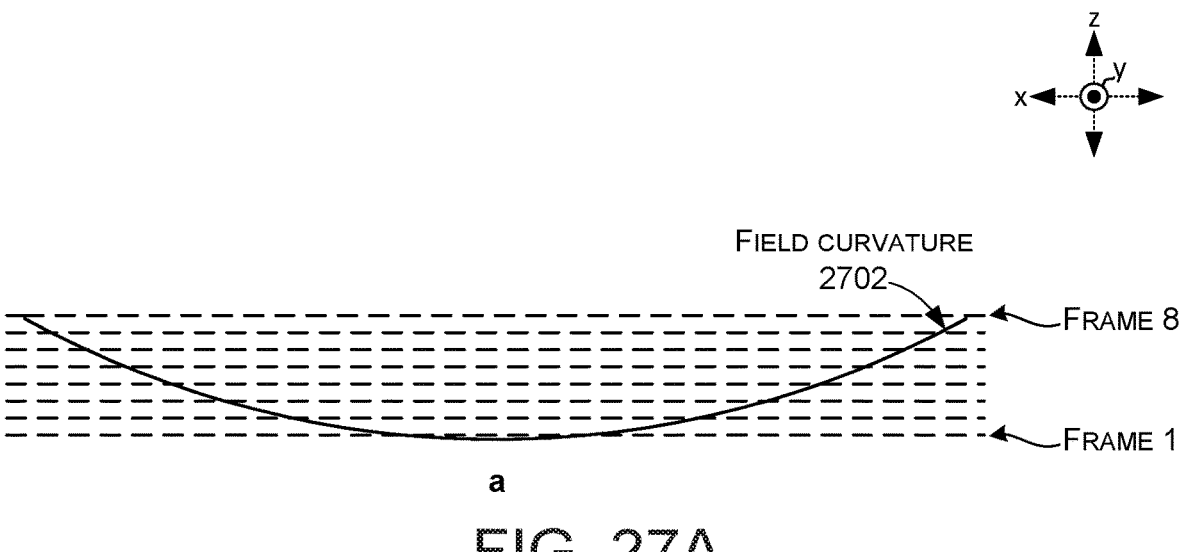
Figure 27B:
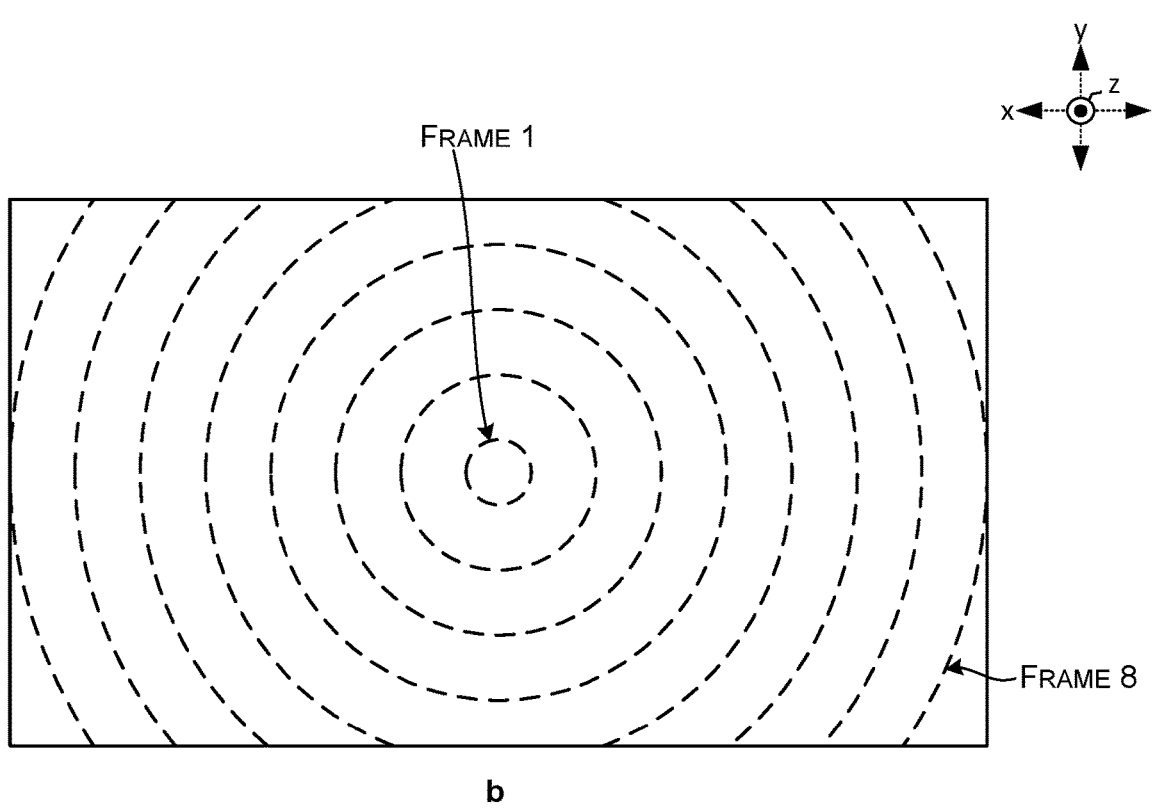

FIGS. 27A and 27B collectively show a technical solution offered by the 6DoF actuator assembly 114 relating to Petzval field curvature correction. When a planar sensor, such as sensor 118 described above, captures images, a flat focal plane in object space produces a curved focal surface in image space. This optical aberration is called Petzval field curvature and is present in all current consumer electronics imaging devices. As a result of this optical aberration, image captures are focused on the center of the image and blurred at the edges.

The 6DoF actuator assembly 114 provides the technical solution by moving the sensor 118 in a pattern that follows the curved focus surface in image space, using linear motion along Z axis (also called Optical Axis). An image capture (frame) is taken on each position along the Z axis. Rotary motion around X and Y axes (wobble) achieves the same result but requires more frame captures.

FIGS. 27A and 27B collectively illustrate the Petzval field curvature correction workflow using linear motion along the Z reference axis. This provides a technical advantage because linear motion along the Z reference axis is the fastest and least computationally expensive way to achieve Petzval field curvature correction. FIG. 27A is a side sectional view where section "a" depicts a cross-section of the field curvature (solid curve) 2702 along the XZ reference plane. Each dashed line corresponds to a frame taken at a different Z-position of the sensor 118 similar to the Instances of FIG. 3.

FIG. 27B is a top elevational view that shows section "b." Each concentric dashed circle corresponds to the location of highest focus in the image, due to field curvature. Once all frames are captured, image processing algorithms produce a high-focus image using the areas around the concentric circles (e.g., Frame 1 through Frame 8).

FIG. 28 shows an example system 2800 that can provide enhanced imaging device performance. For purposes of explanation, system 2800 can include various devices 102 that can communicate via networks 2802 represented by lightning bolts. The devices 102 can include various devices, such as a webcam 102(1), smartphone 102(2), tablet 102(3), notebook computer 102(4), 3D sensor 102(5), such as an Xbox Kinect gaming sensor, security type camera 102(6), and/or augmented reality headset 102(7). The devices also can include vehicles. For instance, the enhanced imaging devices could be used to provide the user with images of blind spots around their car. Alternatively or additionally, the enhanced imaging devices could be used by semi-autonomous or autonomous driving systems on the car. Each of these devices 102 can include one or more cameras (shown but not specifically designated). The cameras can include the 6DoF actuator assemblies 114 described above.

The devices 102 can include actuator controller 810, 6DoF actuation assembly 114, a processor 2806, storage 2808, optical element 302, and/or sensor 118.

The actuator controller 810 can be configured to power individual actuators of the 6DoF actuator assembly to move the sensor 118 and/or the optical element 302 relative to one another along 6DoF. Examples of how these aspects can be achieved are described above.

FIG. 28 shows two device configurations 2816 that can be employed by devices 102. Individual devices 102 can employ either of configurations 2816(1) or 2816(2), or an alternate configuration. (Due to space constraints on the drawing page, one instance of each configuration is illustrated). Briefly, device configuration 2816(1) represents an operating system (OS) centric configuration. Device configuration 2816(2) represents a system on a chip (SOC) configuration. Device configuration 2816(1) is organized into one or more applications 2818, operating system 2820, and hardware 2822. Device configuration 2816(2) is organized into shared resources 2824, dedicated resources 2826, and an interface 2828 therebetween.

In configuration 2816(1), the actuator controller 810 can be manifest as part of the processor 2806. Alternatively, the actuator controller 810 can be manifest as an application that operates in conjunction with the processor 2806. In configuration 2816(2), the actuator controller 810 can be manifest as part of the processor 2806 or a dedicated resource that operates cooperatively with the processor 2806.

The term "device," "computer," or "computing device" as used herein can mean any type of device that has some amount of processing capability and/or storage capability. Processing capability can be provided by one or more processors that can execute data in the form of computer-readable instructions to provide a functionality. Data, such as computer-readable instructions and/or user-related data, can be stored on storage, such as storage that can be internal or external to the device. The storage can include any one or more of volatile or non-volatile memory, hard drives, flash storage devices, and/or optical storage devices (e.g., CDs, DVDs etc.), remote storage (e.g., cloud-based storage), among others. As used herein, the term "computer-readable media" can include signals. In contrast, the term "computer-readable storage media" excludes signals. Computer-readable storage media includes "computer-readable storage devices." Examples of computer-readable storage devices include volatile storage media, such as RAM, and non-volatile storage media, such as hard drives, optical discs, and flash memory, among others.

As mentioned above, device configuration 2816(2) can be thought of as a system on a chip (SOC) type design. In such a case, functionality provided by the device can be integrated on a single SOC or multiple coupled SOCs. One or more processors 2806 can be configured to coordinate with shared resources 2824, such as memory/storage 2808, etc., and/or one or more dedicated resources 2826, such as hardware blocks configured to perform certain specific functionality. Thus, the term "processor" as used herein can also refer to central processing units (CPUs), graphical processing units (GPUs), video processing units, neural processing units, field programmable gate arrays (FPGAs), digital signal processors (DSPs), controllers, microcontrollers, processor cores, or other types of processing devices.

Generally, any of the functions described herein can be implemented using software, firmware, hardware (e.g., fixed-logic circuitry), or a combination of these implementations. The term "component" as used herein generally represents software, firmware, hardware, whole devices or networks, or a combination thereof. In the case of a software implementation, for instance, these may represent program code that performs specified tasks when executed on a processor (e.g., CPU or CPUs). The program code can be stored in one or more computer-readable memory devices, such as computer-readable storage media. The features and techniques of the component are platform-independent, meaning that they may be implemented on a variety of commercial computing platforms having a variety of processing configurations.

ADDITIONAL EXAMPLES

Various examples are described above. Additional examples are described below. One example includes a device comprising an optical element, a sensing element configured to sense light passing through the optical element, a processor configured to receive data from the sensing element, and a set of micro electromechanical systems (MEMS) actuators supporting the sensing element and configured to be individually selectively controlled to create movement of the sensing element relative to the optical element and to convey the data between the sensing element and the processor.

Another example can include any of the above and/or below examples where the set of MEMS actuators comprises six MEMS actuators arranged in a hexagonal shape that contains a moveable area that includes the sensing element or wherein the set of MEMS actuators comprises four MEMS actuators arranged in a square shape that contains a moveable area that includes the sensing element.

Another example can include any of the above and/or below examples where the six MEMS actuators extend from a fixed area to the moveable area.

Another example can include any of the above and/or below examples where the fixed area, the six MEMS actuators, and the moveable area share a common semiconductor substrate.

Another example can include any of the above and/or below examples where conductive traces extend from the fixed area through individual MEMS actuators to the moveable area to convey the data between the sensing element and the processor.

Another example can include any of the above and/or below examples where the conductive traces carry the data between the sensing element and the processor positioned on the fixed area.

Another example can include any of the above and/or below examples where the fixed area, the set of MEMS actuators, and the moveable area lie in a common plane unless the individual MEMS actuators are actuated.

Another example can include any of the above and/or below examples where individual MEMS actuators appear to generally approximate a rectangle as viewed in the common plane, and wherein actuation of an individual MEMS actuator can change dimensions of the rectangle or cause the rectangle to rotate out of the common plane.

Another example can include any of the above and/or below examples where individual MEMS actuators include an actuator element.

Another example can include any of the above and/or below examples where the actuator element functions cooperatively with another actuator element positioned in the fixed area proximate to the individual MEMS actuators.

Another example can include any of the above and/or below examples where the actuator element comprises an electrical coil and the another actuator element comprises a fixed magnet or wherein the another actuator element comprises another electrical coil.

Another example can include any of the above and/or below examples where the actuator element functions cooperatively with another actuator element positioned on a semiconductor substrate positioned on an opposite side of the common semiconductor substrate from the optical element.

Another example can include any of the above and/or below examples where the movement comprises six degrees of freedom (6DoF) movement or the movement comprises less than 6DoF movement.

Another example includes a system comprising an optical element, a sensing element configured to sense light passing through the optical element, and a set of MEMS actuators configured to be individually selectively controlled to create six degrees of freedom (6DoF) movement between the sensing element and the optical element.

Another example can include any of the above and/or below examples where the set of MEMS actuators are positioned around the optical element, or wherein the set of MEMS actuators are positioned around the sensing element.

Another example can include any of the above and/or below examples where the set of MEMS actuators are positioned around the optical element and wherein another set of MEMS actuators are positioned around the sensing element.

Another example includes a device comprising a semiconductor substrate processed to include a set of multiple independently controllable MEMS actuators extending from a fixed area to a central moveable area and individual MEMS actuators comprising a planar ribbon structure that includes a first elongate portion coupled to the fixed area, a second elongate portion that is generally parallel to the first portion, a first switchback-shaped transition portion that extends between the first elongate portion and the second elongate portion, and a third elongate portion that is coupled to the central moveable area and is generally parallel to the second elongate portion and is coupled to the second elongate portion by a second switchback-shaped transition portion that extends between the second elongate portion and the third elongate portion.

Another example can include any of the above and/or below examples where the MEMS actuators further comprise conductive traces extending from the fixed area to the central moveable area.

Another example can include any of the above and/or below examples where a periphery of the first elongate portion, the second elongate portion, the third elongate portion, the first switchback-shaped transition portion and the second switchback-shaped transition portion approximates a rectangle.

Another example can include any of the above and/or below examples where the individual MEMS actuators can be controlled to change dimensions of the rectangle and/or to tilt the rectangle out of a plane of the fixed area and the central moveable area.

Another example can include any of the above and/or below examples where collectively controlling the individual MEMS actuators can create six degrees of freedom (6DoF) movement of the central moveable area, or wherein collectively controlling the individual MEMS actuators can create less than six degrees of freedom (6DoF) movement of the central moveable area.

Another example can include any of the above and/or below examples where the first elongate portion, the second elongate portion, and the third elongate portion are linear or wherein the first elongate portion, the second elongate portion, and the third elongate portion are curvilinear.

Another example can include any of the above and/or below examples where the first switchback-shaped transition portion and the second switchback-shaped transition portion are U-shaped, V-shaped, curvilinear, or rectilinear.

Another example can include any of the above and/or below examples where the first switchback-shaped transition portion and the second switchback-shaped transition portion include flexures that promote bending of the elongate portions.

The invention claimed is:

1. A device, comprising:
an optical element;
a sensing element configured to sense light passing through the optical element;
a processor configured to receive data from the sensing element; and,
a set of micro electromechanical systems (MEMS) actuators extending from a fixed area to a moveable area that includes the sensing element and configured to be individually selectively controlled to create movement of the sensing element relative to the optical element and to convey the data between the sensing element and the processor.

2. The device of claim 1, wherein the set of MEMS actuators comprises six MEMS actuators arranged in a hexagonal shape that contains the moveable area.

3. The device of claim 2, wherein the six MEMS actuators comprise six pairs of MEMS actuators.

4. The device of claim 2, wherein the fixed area, the six MEMS actuators, and the moveable area share a common semiconductor substrate.

5. The device of claim 4, wherein conductive traces extend from the fixed area through individual MEMS actuators to the moveable area to convey the data between the sensing element and the processor.

6. The device of claim 5, wherein the conductive traces carry the data between the sensing element and the processor positioned on the fixed area.

7. The device of claim 6, wherein the fixed area, the set of MEMS actuators, and the moveable area lie in a common plane unless the individual MEMS actuators are actuated.

8. The device of claim 7, wherein individual MEMS actuators appear to generally approximate a rectangle as viewed in the common plane, and wherein actuation of an individual MEMS actuator can change dimensions of the rectangle or cause the rectangle to rotate out of the common plane.

9. The device of claim 8, wherein individual MEMS actuators include an actuator element.

10. The device of claim 9, wherein the actuator element functions cooperatively with another actuator element positioned in the fixed area proximate to the individual MEMS actuators.

11. The device of claim 10, wherein the actuator element comprises an electrical coil and the another actuator element comprises a fixed magnet or wherein the another actuator element comprises another electrical coil.

12. The device of claim 9, wherein the actuator element functions cooperatively with another actuator element positioned on a semiconductor substrate positioned on an opposite side of the common semiconductor substrate from the optical element.

13. The device of claim 1, wherein the movement comprises six degrees of freedom (6DoF) movement or the movement comprises less than 6DoF movement.

14. A system, comprising:
an optical element;
a sensing element configured to sense light passing through the optical element; and,
a set of MEMS actuators having shapes that approximate a rectangle and that lie in a common plane and are configured to be individually selectively controlled to change dimensions of the rectangle or cause the rectangle to rotate out of the common plane to collectively create six degrees of freedom (6DoF) movement between the sensing element and the optical element.

15. The system of claim 14, wherein the set of MEMS actuators are positioned around the optical element, or wherein the set of MEMS actuators are positioned around the sensing element.

16. The system of claim 14, wherein the set of MEMS actuators are positioned around the optical element and wherein another set of MEMS actuators are positioned around the sensing element.

17. A device, comprising:
a semiconductor substrate processed to include a set of multiple independently controllable MEMS actuators extending from a fixed area to a central moveable area; and,
individual MEMS actuators comprising a planar ribbon structure that includes a first elongate portion coupled to the fixed area, a second elongate portion that is generally parallel to the first elongate portion, a first switchback-shaped transition portion that extends between the first elongate portion and the second elongate portion, and a third elongate portion that is coupled to the central moveable area and is generally parallel to the second elongate portion and is coupled to the second elongate portion by a second switchback-shaped transition portion that extends between the second elongate portion and the third elongate portion.

18. The device of claim 17, wherein the MEMS actuators further comprise conductive traces extending from the fixed area to the central moveable area.

19. The device of claim 18, wherein a periphery of the first elongate portion, the second elongate portion, the third elongate portion, the first switchback-shaped transition portion and the second switchback-shaped transition portion approximates a rectangle.

20. The device of claim 19, wherein the individual MEMS actuators can be controlled to change dimensions of the rectangle and/or to tilt the rectangle out of a plane of the fixed area and the central moveable area.

* * * * *